United States Patent
Xuan et al.

(10) Patent No.: US 8,502,259 B2
(45) Date of Patent: Aug. 6, 2013

(54) LIGHT EMITTING DEVICE

(75) Inventors: Rong Xuan, Taipei (TW); Jenq-Dar Tsay, Kaohsiung (TW); Chih-Hao Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 298 days.

(21) Appl. No.: 12/815,432

(22) Filed: Jun. 15, 2010

(65) Prior Publication Data

US 2010/0244085 A1    Sep. 30, 2010

Related U.S. Application Data

(63) Continuation-in-part of application No. 12/146,418, filed on Jun. 25, 2008, now Pat. No. 7,767,996, and a continuation-in-part of application No. 12/117,747, filed on May 9, 2008, now Pat. No. 7,906,786, said application No. 12/146,418 is a continuation-in-part of application No. 12/117,747, filed on May 9, 2008, now Pat. No. 7,906,786.

(60) Provisional application No. 61/020,397, filed on Jan. 11, 2008.

(51) Int. Cl.
*H01L 33/00* (2010.01)
(52) U.S. Cl.
USPC .................... 257/99; 257/103; 257/E33.066
(58) Field of Classification Search
USPC .................................. 257/103, E33.066, 99
See application file for complete search history.

(56) References Cited

U.S. PATENT DOCUMENTS

| | | | |
|---|---|---|---|
| 4,450,460 | A | 5/1984 | Morimoto |
| 4,806,885 | A | 2/1989 | Morimoto |
| 5,481,508 | A | 1/1996 | Watanabe et al. |
| 5,874,749 | A | 2/1999 | Jonker |
| 6,368,889 | B1 | 4/2002 | Suemasu |
| 6,788,541 | B1 | 9/2004 | Hsiung |
| 6,858,866 | B2 | 2/2005 | Chen |
| 7,301,174 | B1 | 11/2007 | Popovich |
| 7,767,996 | B2 | 8/2010 | Xuan et al. |
| 7,858,991 | B2 | 12/2010 | Xuan et al. |

(Continued)

FOREIGN PATENT DOCUMENTS

| | | |
|---|---|---|
| JP | 09-219564 | 8/1997 |
| JP | H09-293931 | 11/1997 |

(Continued)

OTHER PUBLICATIONS

"Second Office Action of China Counterpart Application", issued on Sep. 7, 2011, p. 1-p. 7, in which the listed references were cited.

(Continued)

*Primary Examiner* — David S Blum
(74) *Attorney, Agent, or Firm* — Jianq Chyun IP Office

(57) ABSTRACT

A light emitting device including a light emitting chip and a magnetic material is provided. The light emitting chip includes a first doped semiconductor layer, a second doped semiconductor layer, and a light emitting semiconductor layer disposed between the first doped semiconductor layer and the second doped semiconductor layer. The magnetic material is disposed beside the light emitting chip, wherein the magnetic material is not disposed on a conducting path of a current causing the light emitting chip to emit light.

24 Claims, 20 Drawing Sheets

U.S. PATENT DOCUMENTS

| | | |
|---|---|---|
| 7,906,786 B2 | 3/2011 | Xuan et al. |
| 7,928,463 B2 | 4/2011 | Xuan |
| 7,989,818 B2 | 8/2011 | Xuan et al. |
| 8,243,769 B2 | 8/2012 | Furushima et al. |
| 8,299,692 B2 | 10/2012 | Lee et al. |
| 2005/0018725 A1 | 1/2005 | Nurmikko |
| 2005/0139885 A1 | 6/2005 | Liu |
| 2006/0043400 A1 | 3/2006 | Erchak et al. |
| 2006/0124953 A1 | 6/2006 | Negley et al. |
| 2006/0186432 A1 | 8/2006 | Osipov et al. |
| 2006/0192223 A1 | 8/2006 | Lee et al. |
| 2007/0287236 A1 | 12/2007 | Kim |
| 2008/0251805 A1 | 10/2008 | Lin |

FOREIGN PATENT DOCUMENTS

| | | | |
|---|---|---|---|
| JP | 2006-253288 | | 9/2006 |
| JP | 1996-023768 | * | 8/2009 |
| TW | 449949 | | 8/2001 |
| TW | 517403 | | 1/2003 |
| TW | 200532948 | | 10/2005 |
| TW | 200711177 | | 3/2007 |
| TW | I282182 | | 6/2007 |
| TW | I284991 | | 8/2007 |
| TW | I287255 | | 9/2007 |
| TW | M323689 | | 12/2007 |
| TW | 200814333 | | 3/2008 |
| TW | 200832504 | | 8/2008 |
| TW | 200834670 | | 8/2008 |

OTHER PUBLICATIONS

"1st Office Action of China Counterpart Application" issued on May 11, 2010, p. 1-p. 6.

"Office Action of Taiwan Counterpart Application (Application No: 098123443)", issued on Oct. 23, 2012, p. 1-p. 8, in which US7767996, US7858991, US7906786, US7928463, US7989818, TW200834670 and TW517403 were cited.

"Office Action of Taiwan Counterpart Application (Application No: 098123447)", issued on Oct. 23, 2012, p. 1-p. 4, in which TW200814333, TW200832504 and TWI287255 were cited.

"Office Action of Japan Counterpart Application", issued on Nov. 13, 2012, p. 1-p. 3, in which the listed references were cited.

"Office Action of Taiwan Counterpart Application", issued on Aug., 15, 2012, p. 1-p. 10, in which the listed references were cited.

"Office Action of Taiwan Counterpart Application (Application No: 098123570)", issued on Sep. 24, 2012, p. 1-p. 8, in which US6788541 and TW200532948 were cited.

"Office Action of Taiwan Counterpart Application (Application No: 098121422)", issued on Sep. 13, 2012, p. 1-p. 6, in which TW449949, TWM323689, TW200711177 and below NPL were cited.

Diao-Yuan Huang, "Semiconductor Devices Physics and Technology (2nd Edition)", National Chiao Tung University Press, Sep. 1, 2006, pp. 1-6.

"Office Action of Taiwan Co-pending Application, application No. 98122615", issued on Sep. 27, 2012, p. 1-p. 8, in which the listed references were cited.

"Office Action of Taiwan Counterpart Application", issued on Apr. 25, 2013, p1-p4, in which the listed references were cited.

"Office Action of U.S. Counterpart Application", issued on May 9, 2013, p1-p23, in which the listed references were cited.

* cited by examiner (a)

(b)

(c)

LIGHT EMITTING DEVICE

CROSS-REFERENCE TO RELATED APPLICATION

This application is a continuation in part application of and claims the priority benefits of U.S. application Ser. No. 12/146,418, now U.S. Pat. No. 7,767,996, filed on Jun. 25, 2008, and of and U.S. application Ser. No. 12/117,747, now U.S. Pat. No. 7,906,786, filed on May 9, 2008. The prior application Ser. No. 12/146,418 is a continuation in part application of and claims the priority benefit of U.S. application Ser. No. 12/117,747. The prior application Ser. No. 12/117,747 claims the priority benefit of U.S. provisional application Ser. No. 61/020,397, filed on Jan. 11, 2008. The entirety of each of the above-mentioned patent applications is hereby incorporated by reference herein and made a part of this specification.

BACKGROUND OF THE INVENTION

1. Technical Field

The disclosure is related to a light emitting device. More particularly, the disclosure is related to a light emitting device applying an energy field.

2. Background

Distinct from regular fluorescent lamps or incandescent lamps that generate heat to emit light, semiconductor light emitting devices such as light emitting diodes (LEDs) adopt the specific property of semiconductor to emit light, in which the light emitted by the light emitting devices is referred to as cold luminescence. The light emitting devices have advantages of long service life, light weight, and low power consumption, such that the light emitting devices have been employed in a wide variety of applications, such as optical displays, traffic lights, data storage apparatus, communication devices, illumination apparatus, and medical treatment equipment. Accordingly, how to improve the light emitting efficiency of light emitting devices is an important issue in this art.

FIG. 1 is a schematic diagram illustrating a cross-sectional view of a conventional light emitting device. Referring to FIG. 1, the light emitting device 100 is a vertical type light emitting diode (LED), which includes electrodes 110 and 120, a first doped layer 130, a second doped layer 140, and a semiconductor light emitting layer 150. The distribution of the current density is decreased gradually as the distance deviating from the electrodes 110 and 120 is increased. As shown in FIG. 1, the tight lines represent high current density, and the area with most number of lines is located between the electrodes 110 and 120. However, due to the congenital deficiency, the area with highest light emitting efficiency is blocked by the electrode 110, such that the overall light emitting efficiency of the light emitting device 100 is affected.

FIG. 2 is a schematic diagram illustrating a top view of a conventional light emitting device. Referring to FIG. 2, the light emitting device 200 is a horizontal type LED, which includes electrodes 210 and 220. Because the current always transmits through a path with lowest resistance, the distribution of the current density is inhomogeneous between the electrodes 210 and 220, where the main distribution of the current density is along the central path between the electrodes 210 and 220. Therefore, in order to increase the amount of light emitted by the light emitting device 200, the uniform current distribution area is needed to be enlarged, such that the size of the light emitting device 200 is enlarged.

Based on aforesaid description, it is concluded that the light emitting efficiency of the light emitting device may be influenced by the following factors.

1. The area between the electrodes of the light emitting device is not only the area with highest current carrier density, but also the area producing most photons. However, the photons produced between the electrodes are mostly blocked by the opaque electrode, such that the light emitting efficiency is hard to be enhanced.

2. The current always transmits through a path with lowest resistance, which results in inhomogeneous luminance of the light emitting device, such that the light emitting efficiency and the size of the light emitting device are also limited.

SUMMARY

An embodiment of the disclosure provides a light emitting device including a light emitting chip and a magnetic material. The light emitting chip includes a first doped semiconductor layer, a second doped semiconductor layer, and a light emitting semiconductor layer disposed between the first doped semiconductor layer and the second doped semiconductor layer. The magnetic material is disposed beside the light emitting chip, wherein the magnetic material is not disposed on a conducting path of a current causing the light emitting chip to emit light.

An embodiment of the disclosure provides a light emitting device including a light emitting chip and a magnetic material. The light emitting chip includes a semiconductor stack structure. The semiconductor stack structure includes a first doped semiconductor layer, a second doped semiconductor layer, and a light emitting semiconductor layer disposed between the first doped semiconductor layer and the second doped semiconductor layer. The magnetic material is disposed beside the light emitting chip, wherein the magnetic material does not directly contact the semiconductor stack structure.

An embodiment of the disclosure provides a light emitting device and a magnetic material. The light emitting chip includes a semiconductor stack structure, a first electrode, and a second electrode. The semiconductor stack structure includes a first doped semiconductor layer, a second doped semiconductor layer, and a light emitting semiconductor layer disposed between the first doped semiconductor layer and the second doped semiconductor layer. The first electrode is electrically connected to the first doped semiconductor layer. The second electrode electrically is connected to the second doped semiconductor layer, wherein the first electrode and the second electrode are located on a same side of the semiconductor stack structure. The magnetic material is disposed beside the light emitting chip, wherein the magnetic material has a size lager than a size of the first electrode and larger than a size of the second electrode.

An embodiment of the disclosure provides a light emitting device including a light emitting chip and a magnetic film. The light emitting chip includes a first doped semiconductor layer, a second doped semiconductor layer, and a light emitting semiconductor layer disposed between the first doped semiconductor layer and the second doped semiconductor layer, wherein the light emitting chip has a light emitting surface. The magnetic film covers the light emitting surface, wherein light emitted from the light emitting semiconductor layer passes through the light emitting surface and the magnetic film and is then transmitted to an outside of the light emitting device.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

If a current flows through a conductor in a magnetic field, the magnetic field exerts a transverse force on the moving charge carriers which tends to push them to one side of the conductor. This is most evident in a thin flat conductor. A buildup of charge at the sides of the conductors will balance this magnetic influence, producing a measurable voltage between the two sides of the conductor. The presence of this measurable transverse voltage is called Hall Effect.

The disclosure takes advantages of the Hall Effect and conducts an energy field on optoelectronic semiconductor devices. The externally added energy force will change the direction and path of the current flowing between the electrodes of the semiconductor device, so as to enhance the light emitting efficiency and current homogeneity of the light emitting device. Embodiments are given below for describing the detailed structure and current path of the light emitting device.

Figure 3:
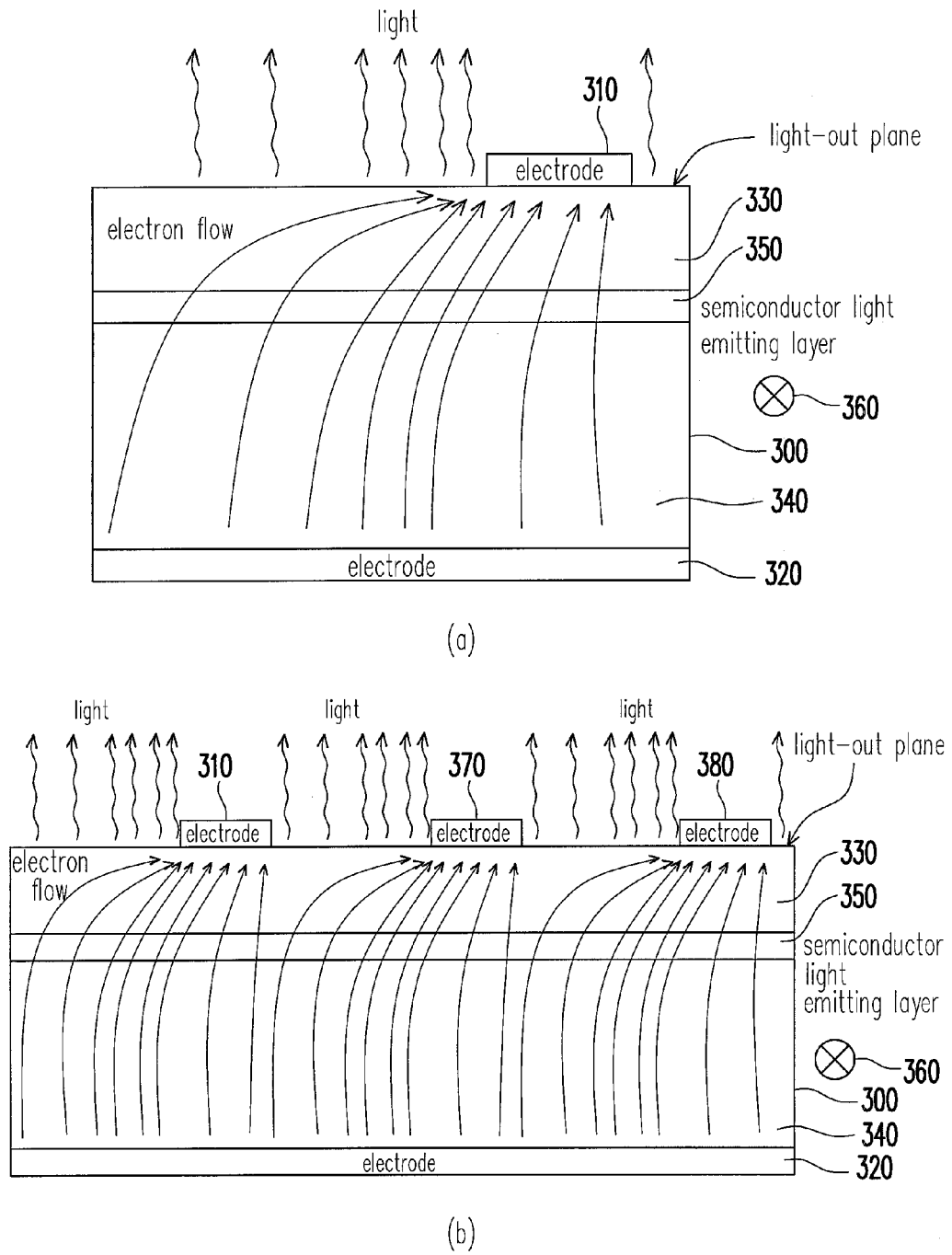
FIG. 3(a)~3(b) are schematic diagrams illustrating a cross-sectional view of a light emitting device according to one embodiment of the disclosure.

FIG. 3(a) and FIG. 3(b) are schematic diagrams illustrating a cross-sectional view of a light emitting device according to one embodiment of the disclosure. Referring to FIG. 3(a), the light emitting device 300 is a vertical type LED, which includes electrodes 310 and 320, a first doped layer 330, a second doped layer 340, and a semiconductor light emitting layer 350, in which the first doped layer 330 and the second doped layer 340 may be an P doped layer or an N doped layer. The light emitting device 300 is covered by a magnetic field 360, which is produced by a magnetic source and directed inward the cross-sectional plane of the light emitting device 300. The Lorenz's force induced by the magnetic field pushes the electrons so as to make the current drift to the left. As shown in FIG. 3(a), the main distribution of the current density (represented by current lines) is moved from an area between the electrodes 310 and 320 to an area under the light-out plane, which means the area having the highest light emitting efficiency is no longer blocked by the electrode 310 and an overall light emitting efficiency of the light emitting device 300 can be substantially enhanced. The light-out plane as described above and hereinafter is defined as a surface of the first doped layer 330 uncovered by the electrodes. It should be emphasize herein that as long as a weight of the magnetic field is perpendicular to the flowing direction of the internal current in the light emitting device 300, an electric force is induced to drift the current and the light emitting efficiency can be enhanced.

Referring to FIG. 3(b), the light-out plane of the light emitting device 300 is expanded and disposed with plural electrodes 310, 370, and 380 thereon. As shown in FIG. 3(b), the distribution of the current density (represented by current lines) between the electrode 320 and each of the electrodes 310, 370, and 380 are all moved from the area between the electrodes to the area under the light-out plane, such that an overall light emitting efficiency of the light emitting device 300 is substantially enhanced. Moreover, the distributions of the current density under the light-out plane between two electrodes 310 and 370 and two electrodes 370 and 380 are the same. Therefore, the light emitting device 300 of the disclosure is able to provide higher luminance without affecting the homogeneity of light.

Figure 4:
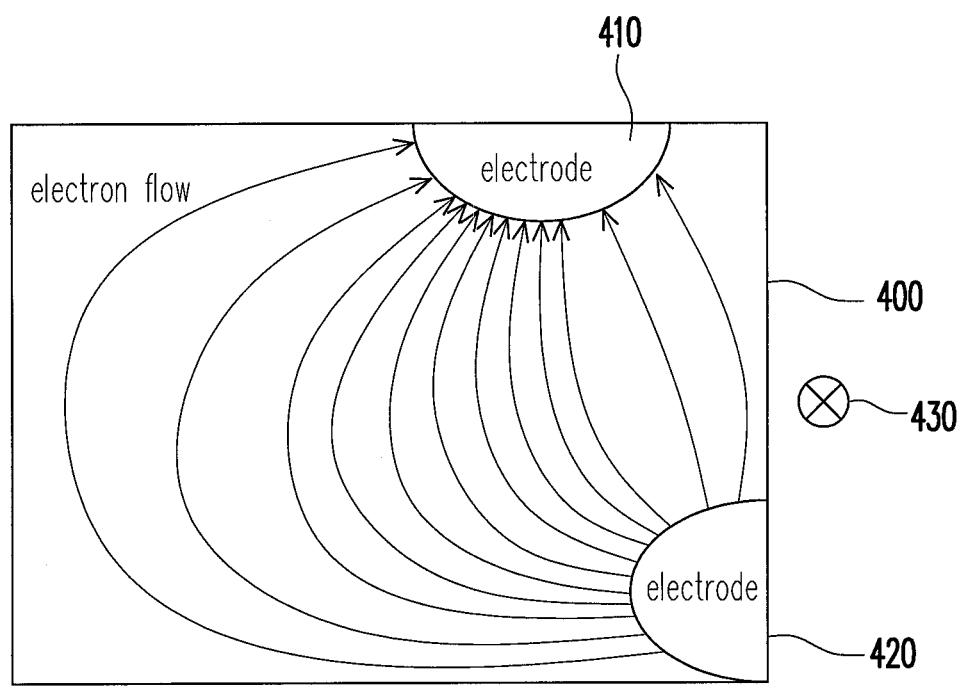
FIG. 4 is a top view of a light emitting device according to another embodiment of the disclosure.

In another embodiment, FIG. 4 is a top view of a light emitting device according to another embodiment of the disclosure. Referring to FIG. 4, the light emitting device 400 is a horizontal type LED, which includes electrodes 410 and 420. Similar to the forgoing embodiment, as the magnetic force pushes the electrons out of the paths between the electrodes 410 and 420, the distribution of current density is moved to the left part of the light emitting device 400. As shown in FIG. 4, the current path is spread to a larger area (left area), which creates a more homogeneous distribution of the current density.

As for the capability for spreading drift current, the related principle is derived below for illustrating how the external magnetic filed affects the current density.

In physics, the Lorentz force is the force exerted on a charged particle in an electromagnetic field. The particle will experience a force due to an electric field of qE, and due to the magnetic field $q \cdot \vec{v} \times \vec{B}$. The force F induced by the magnetic field B can be calculated by the following Lorentz force equation:

$$F = -q\left(\vec{E} + \frac{1}{c}\vec{v} \times \vec{B}\right),$$
$$\vec{B} = B_x + B_y + B_z,$$
$$\vec{v} = v_x + v_y + v_z,$$
$$\vec{E} = E_x + E_y + E_z,$$

where F is the Lorentz force, E is the electric field, B is the magnetic field, q is the electric charge of the particle, v is the instantaneous velocity of the electrons, and x is the cross product. Electrons will be accelerated in the same linear orientation as the electric field E, but will curve perpendicularly to both the instantaneous velocity vector v and the magnetic field B according to the right-hand rule.

In a static electric field, the time derivative are zero, so that the drift velocity is as follows:

$$v_x = -\frac{e\tau}{m}\left(E_x + \frac{B_z}{c}V_y - \frac{B_y}{c}V_z\right),$$

-continued
$$v_y = -\frac{e\tau}{m}\left(E_y - \frac{B_z}{c}V_x - \frac{B_y}{c}V_z\right),$$
$$v_z = -\frac{e\tau}{m}\left(E_z + \frac{B_y}{c}V_x - \frac{B_x}{c}V_y\right),$$

where m is the effective mass of an electron.

Based on the forgoing equations, it is concluded that the electrons are drifted in a helical path with an angular velocity $$w_c = \frac{eB}{mc}$$

along the axis of the static magnetic field B. For example, to spread the drift current to a negative x axis direction, the weight of the magnetic field in the z axis ($B_z$) needs to be increased and the weight of the magnetic field in the y axis ($B_y$) needs to be reduced. In addition, when the velocity of the external current in the y axis direction is increased, the velocity of the current in the x axis direction is also increased, such that the current homogeneity may be enhanced. It should be emphasized herein that as long as a weight of the magnetic field is perpendicular to the flowing direction of the internal current in the LED, an electromagnetic force is induced to drift the current and the light emitting efficiency can be enhanced. The same idea may also be applied to other light emitting devices such as laser diode (LD), which is not limited to it.

With the external magnetic field applied to the light emitting device, not only the current path is changed, but also the homogeneity of the carrier density in the semiconductor is altered. Accordingly, the light emitting device has a higher efficiency for optoelectronic transformation even though the amount of injected current remains unchanged.

It should be noted herein that the strength of the external magnetic field applied to the light emitting device of the disclosure is larger than 0.01 Tesla and may be a constant value, a time-varying value, or a gradient-varying value, but is not limited to them. In addition, the angle between the direction of the magnetic field and the light emitting direction is from 0 to 360. Moreover, the magnetic field may be provided by a magnet, magnetic thin film, an electromagnet, or any other kind of magnetic material and the number of the magnetic source can be more than one.

Based on the forgoing conclusion, in an actual application, the light emitting devices can be combined with magnetic material through various manners such as epoxy, metal bonding, wafer bonding, epitaxy embeding and coating. In addition, the magnetic material may be coupled to the light emitting device itself and produced as a substrate, a submount, an electromagnet, a slug, a holder, or a magnetic heat sink or produced as a magnetic film or a magnetic bulk, so as to provide the magnetic field for the light emitting device. The magnetic material may be ferromagnetic material such as Rb, Ru, Nd, Fe, Pg, Co, Ni, Mn, Cr, Cu, Cr2, Pt, Sm, Sb, Pt, or an alloy thereof. The magnetic material may also be ceramic material such as oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)xCl_2.6H_2O$, $FeCo_3$, and $FeCo_3.2MgCO_3$. The light emitting device can be an organic LED (OLED), an inorganic LED, a vertical type LED, a horizontal type LED, a thin film LED, or a flip chip LED. Embodiments of the light emitting device adopting foregoing structures are described respectively below.

Figure 5A:
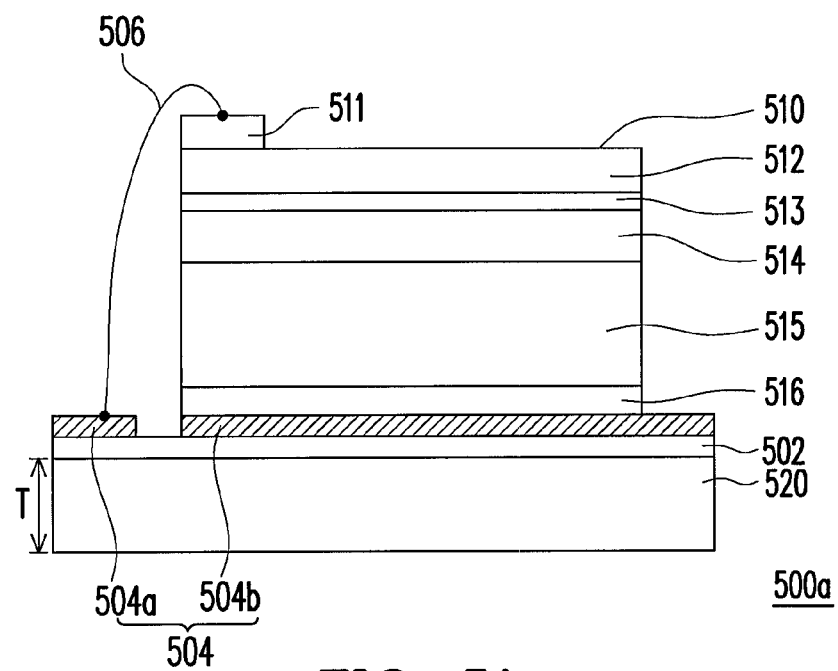
FIG. 5A is a cross-sectional diagram illustrating a structure of a light emitting device according to one embodiment of the disclosure.
Figure 5B:
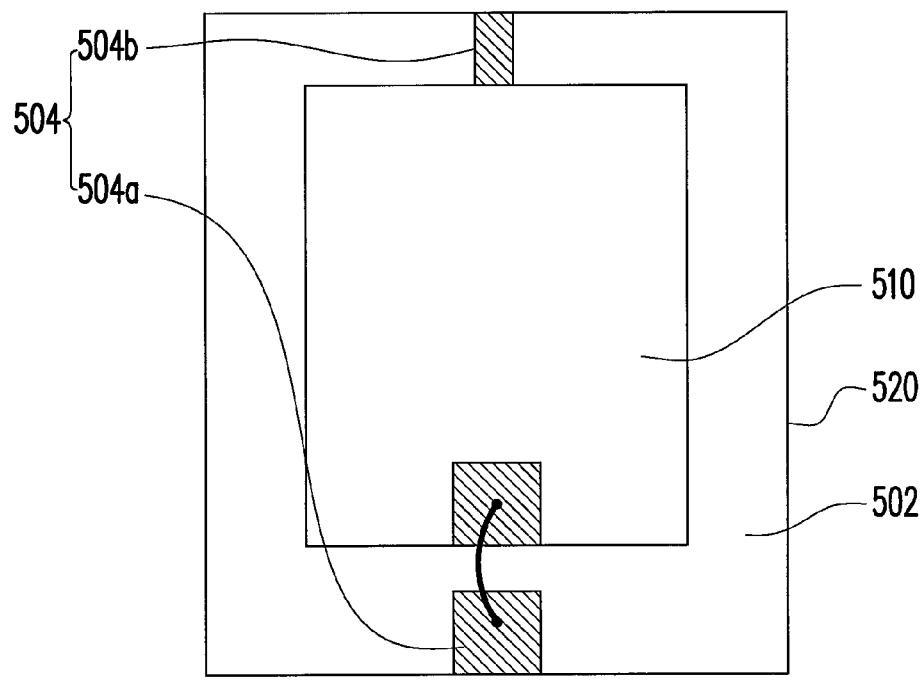
FIG. 5B is a top view of the light emitting device of FIG. 5A.

FIG. 5A is a cross-section view of a light emitting device according to an exemplary embodiment, and FIG. 5B is a top view of the light emitting device of FIG. 5A. Referring to FIGS. 5A and 5B, as for a standard LED having a vertical type structure, the light emitting device 500a of the present embodiment is a vertical type LED, which includes a light emitting chip 510 and a magnetic material (e.g. a magnetic submount 520). The magnetic submount 520 is disposed beside the light emitting chip 510. In this embodiment, the light emitting chip 510 is disposed on the magnetic submount 520 through an epoxy, a metal bonding, a wafer bonding, epitaxy embeding, or a coating process.

The light emitting chip 510 includes, from top to bottom, a first electrode 511, a first doped layer 512, an active layer 513 (e.g. a light emitting semiconductor layer), a second doped layer 514, a substrate 515, and a second electrode 516, in which the first doped layer 512, the active layer 513, and the second doped layer 514 form a light emitting stacking layer (i.e. a semiconductor stack structure), which is disposed on the substrate 515. The first electrode 511 is disposed on the first doped layer 512 and electrically coupled to the first doped layer 512, and the second electrode 516 is disposed under the substrate 515 and electrically coupled to the second doped layer 514, so as to form a vertical type LED structure. The active layer 513 is disposed between first electrode 511 and the second electrode 516, and capable of generating light when a current flows through it. It should noted herein that the material of the substrate 515 may be Si, SiC, GaN, GaN, GaP, GaAs, sapphire, ZnO, or AlN, and the material of the light emitting stacking layer may be inorganic semiconductor material such as GaAs, InP, GaN, GaP, AlP, AlAs, InAs, GaSb, InSb, CdS, CdSe, ZnS, or ZnSe, or organic semiconductor material such as polymer.

The magnetic field induced by the magnetic submount 520 is exerted on the light emitting chip 510, such that the main distribution of current density in the light emitting chip 510 is moved from an area between the first electrode 511 and the second electrode 516 to an area under the light-out plane, so as to enhance the current homogeneity and increase an overall brightness of the light emitting device 500a.

In this embodiment, the magnetic submount 520 is not disposed on a conducting path of a current, wherein the conducting path passes through the first doped layer 512, the active layer 513, and the second doped layer 514. The current causes the light emitting chip 510 to emit light, and the current does not pass through the magnetic submount 520. Specifically, the light emitting device 500a may include an insulation layer 502 and a circuit layer 504. The insulation layer 502 is disposed between the light emitting chip 510 and the magnetic submount 520 for insulating the light emitting chip 510 and the magnetic submount 520. The circuit layer 504 is disposed on the insulation layer 502, wherein the insulation layer 502 insulates the circuit layer 504 and the magnetic submount 520. The circuit layer 504 includes a first circuit 504a and a second circuit 504b. The first circuit 504a is electrically connected to the first doped layer 512, and the second circuit 504b is electrically connected to the second doped layer 514. In this embodiment, the circuit layer 504 having two circuit is taken as an example, but the disclosure is not limited thereto. In other embodiments, the number of the circuits of the circuit layer 504 may be adjusted according to the size of the light emitting device 500a or other requirements.

In this embodiment, the first electrode 511 and the second electrode 516 are respectively disposed on opposite sides of the semiconductor stack structure, and the light emitting device 500a further includes a bonding wire 506 connecting the first electrode 511 and the first circuit 504a. The material of the bonding wire 506 is, for example, gold (Au), gold-tin alloy (AuSn), lead-tin alloy (PbSn), or other suitable metals. Moreover, the first doped layer 512 and second doped layer 514 are respectively an n-type semiconductor layer and a p-type semiconductor layer, or are respectively a p-type semiconductor layer and an n-type semicouductor layer. When the first doped layer 512 and second doped layer 514 are respectively an n-type semiconductor layer and a p-type semiconductor layer, the path of the current causing the active layer 513 to emit light passes through the second circuit 504b, the second electrode 516, the substrate 515, the second doped layer 514, the active layer 513, the first doped layer 512, the first electrode 511, the bonding wire 506, and the first circuit 504a and does not pass through the magnetic submount 520 due to the insulation layer 502.

In this embodiment, the thickness T of the magnetic submount 520 is greater than 1 millimeter, and the layers and elements of the light emitting device 500a are not drawn to scale in FIG. 5A. Specifically, the thickness T of the magnetic submount 520 may larger than the thickness of the light emitting chip 510. Moreover, in this embodiment, the magnetic submount 520 does not directly contact the semiconductor stack structure. For example, there is an insulation layer 502 disposed between the magnetic submount 520 and the semiconductor stack structure.

In this embodiment, the magnetic submount 520 has a size larger than the first electrode 511 and the second electrode 516. For example, the area of the magnetic submount 520 in a direction parallel to the active layer 513 is larger than the area of the first electrode 506 in the direction parallel to the active layer 513 and is larger than the area of the second electrode 516 in the direction parallel to the active layer 513.

Figure 6:
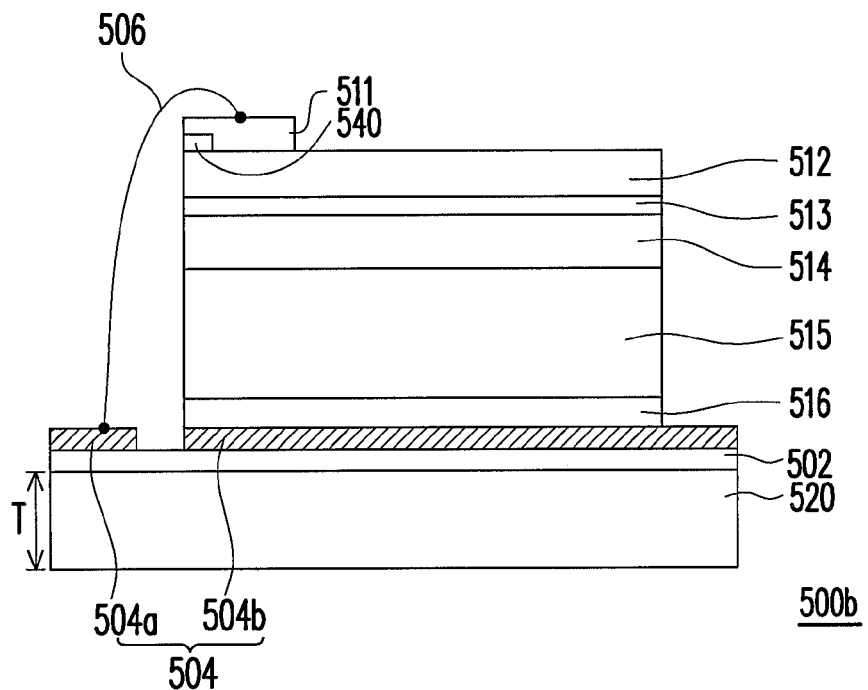
FIG. 6 is a cross-sectional diagram illustrating a structure of a light emitting device according to one embodiment of the disclosure.

In one embodiment of the disclosure, a block layer are further disposed in the light emitting device to enhance the brightness thereof. FIG. 6 is a cross-sectional diagram illustrating a structure of a light emitting device according to one embodiment of the disclosure. Referring to FIG. 6, the light emitting device 500b of this embodiment is similar to the light emitting device 500a according to the embodiment of FIG. 5A, and the current path of the light emitting device 500b is similar to that of the light emitting device 500a. In this specification, the elements having the same reference number represents the same or similar elements. The difference between the light emitting device 500b and the light emitting device 500a is as follows. In the light emitting device 500b of the present embodiment, a block layer 540 is disposed between the first electrode 511 and the first doped layer 512 for blocking a part of the electrical connection between first electrode 511 and the first doped layer 512. Accordingly, the block layer 540 blocks a part of current paths under the first electrode 511 and leaves a gap for the other part of current to flow out, such that the main distribution of current density is moved from an area under the first electrode 511 to an area under the light-out plane, thus increasing the brightness of the light emitting device 500b.

Figure 7:
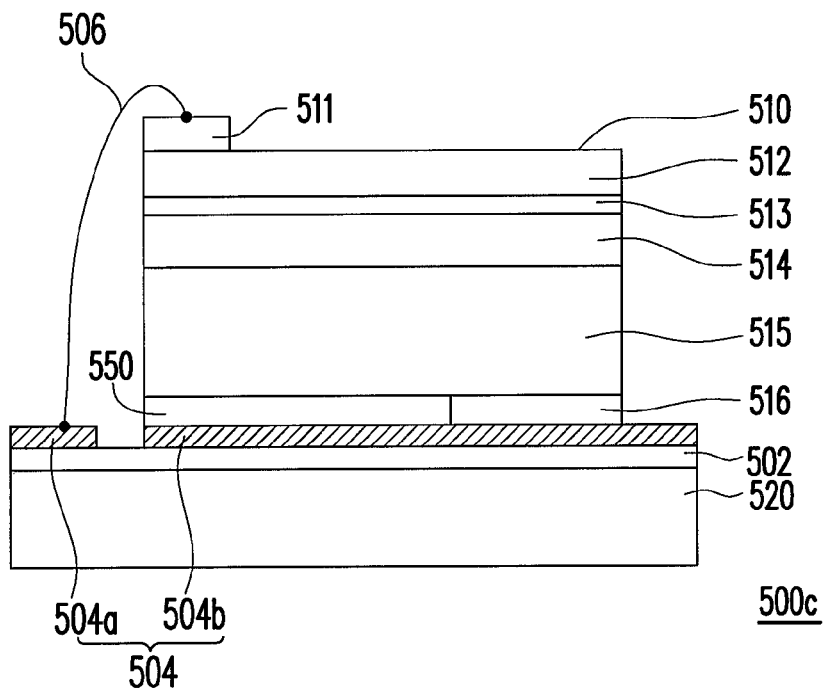
FIG. 7 is a cross-sectional diagram illustrating a structure of a light emitting device according to one embodiment of the disclosure.

In one embodiment of the disclosure, an isolating layer is further disposed in the light emitting device to enhance the brightness thereof. FIG. 7 is a cross-sectional diagram illustrating a structure of a light emitting device according to one embodiment of the disclosure. Referring to FIG. 7, the light emitting device 500c of this embodiment is similar to the light emitting device 500a according to the embodiment of FIG.

5A, and the difference between the light emitting device 500c and the light emitting device 500a is as follows. In the light emitting device 500c of the present embodiment, an isolating layer 550 is further disposed between the substrate 515 and the magnetic submount 520 as described in the previous embodiment. Similar to the effect of block layer 540, the isolating layer 550 blocks most current paths under the first electrode 511 and forces the main distribution of current density out of an area under the first electrode 511 to an area under the light-out plane, thus increasing the brightness of the light emitting device 500c.

Figure 8:
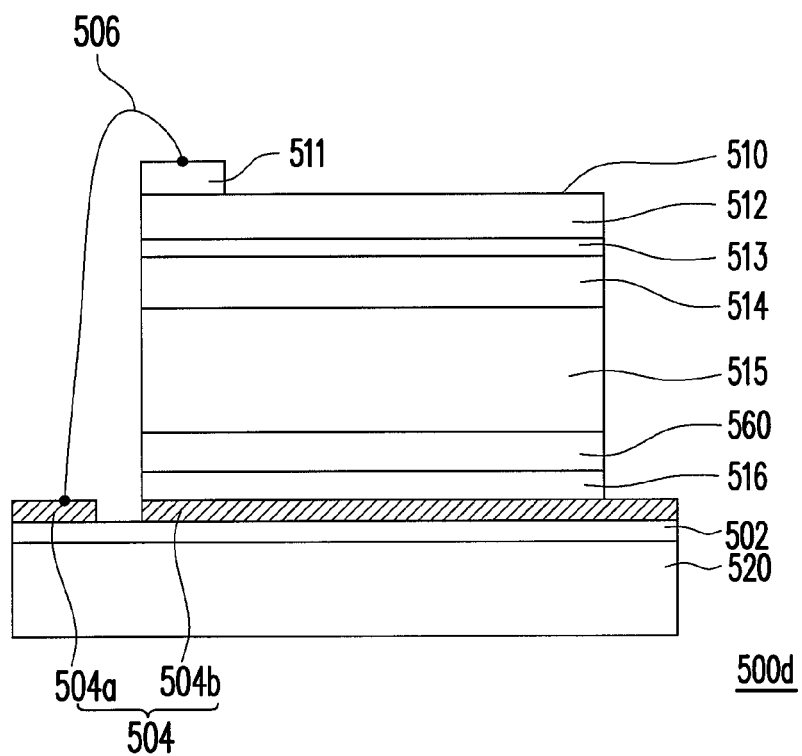
FIG. 8 is a cross-sectional diagram illustrating a structure of a light emitting device according to one embodiment of the disclosure.

In one embodiment of the disclosure, a mirror layer is further disposed in the light emitting device to enhance the brightness thereof. FIG. 8 is a cross-sectional diagram illustrating a structure of a light emitting device according to one embodiment of the disclosure. Referring to FIG. 8, the light emitting device 500d of this embodiment is similar to the light emitting device 500a according to the embodiment of FIG. 5A, and the difference between the light emitting device 500d and the light emitting device 500a is as follows. In the light emitting device 500d of the present embodiment, a mirror layer 560 is further disposed between the substrate 515 and the second electrode 516 for reflecting the light emitted from the active layer 513, so as to increase the brightness of the light emitting device. It should be noted herein that, in other embodiments, the mirror layer 560 may also be disposed between second doped layer 514 and the substrate 515 or between the second electrode 516 and the magnetic submount 520 for reflecting light, but not limited to them.

Figure 9:
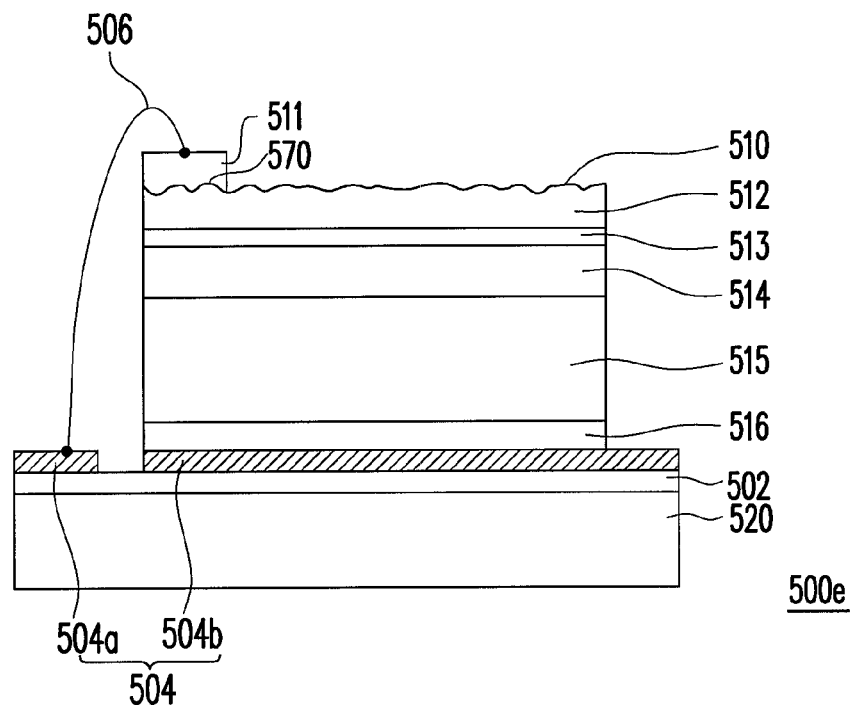
FIG. 9 is cross-sectional diagram illustrating a structure of a light emitting device according to one embodiment of the disclosure.

In one embodiment of the disclosure, a roughness pattern, a trapezoid pattern, a round pattern, or a photonic crystal layer is further fabricated to enhance the brightness of the light emitting device. FIG. 9 is a cross-sectional diagram illustrating a structure of a light emitting device according to one embodiment of the disclosure. Referring to FIG. 9, the light emitting device 500e of this embodiment is similar to the light emitting device 500a according to the embodiment of FIG. 5A, and the difference between the light emitting device 500e and the light emitting device 500a is as follows. In the light emitting device 500e of the present embodiment, a roughness pattern 570 is fabricated on a top surface of the first doped layer 512 to increase the surface reflectivity of the first doped layer 512. Moreover, the roughness pattern may be fabricated on the top surface of the substrate 515 (or the bottom surface of the second doped layer 514) to increase the surface reflectivity of the substrate 515, or fabricated on the top surface of the second electrode 516 (or the bottom surface of the substrate 515) to increase the surface reflectivity of the second electrode 516. It should be noted herein that the roughness pattern as described above, a trapezoid pattern, a round pattern, or a photonic crystal layer may be fabricated on one of, or parts of, or all of the top surfaces and the bottom surfaces of the first doped layer 512, the second doped layer 514, the first electrode 511, the second electrode 516, the substrate 515, the magnetic submount 520, and the combination thereof, which is not limited to them.

Figure 10:
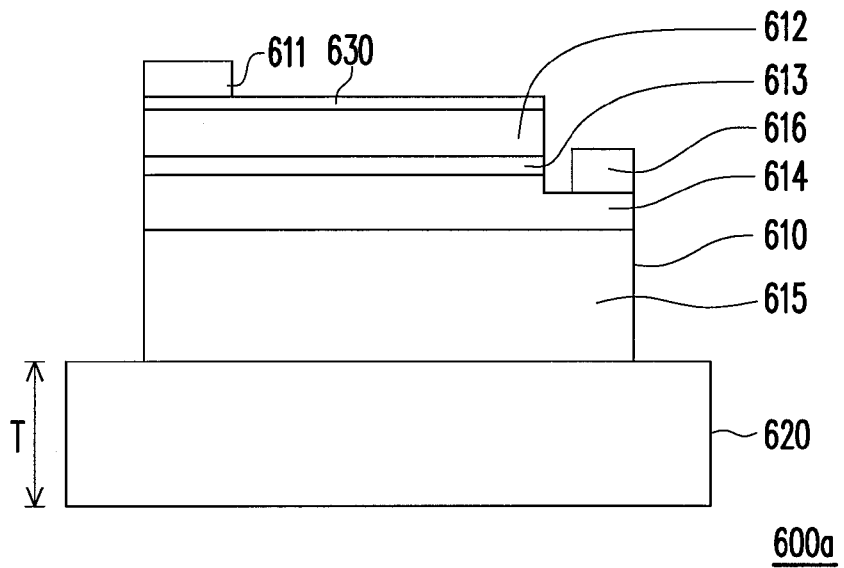
FIG. 10 is a cross-sectional diagram illustrating a structure of a light emitting device according to one embodiment of the disclosure.

As for a standard LED having a horizontal type structure, FIG. 10 is a cross-sectional diagram illustrating a structure of a light emitting device according to one embodiment of the disclosure. Referring to FIG. 10, the light emitting device 600a of the present embodiment is a horizontal type LED, which includes a light emitting chip 610 and a magnetic submount 620. The light emitting chip 610 is disposed on the magnetic submount 620 through an epoxy, a metal bonding, a wafer bonding, epitaxy embeding, or a coating process.

The light emitting chip 610 includes, from top to bottom, a first electrode 611, a first doped layer 612, an active layer 613, a second doped layer 614, and a substrate 615, in which the first doped layer 612, the active layer 613, and the second doped layer 614 form a light emitting stacking layer, which is disposed on the substrate 615. The first electrode 611 is disposed on the first doped layer 612 and electrically coupled to the first doped layer 612, and the second electrode 616 is disposed on a surface of the second doped layer 614 uncovered by the active layer 613 and electrically coupled to the second doped layer 614, so as to form a horizontal type LED structure. The active layer 613 is disposed between first electrode 611 and the second electrode 616, and capable of generating light when a current flows through it.

The magnetic field induced by the magnetic submount 620 is exerted on the light emitting chip 610, such that the effect of current crowding is reduced, so as to enhance the current homogeneity and an overall brightness of the light emitting device 600a.

In this embodiment, a transparent conductive layer (TCL) 630 is disposed on the first doped layer 612 and between the first electrode 611 and the first doped layer 612. In an embodiment the TCL 630 includes a two-layer structure. For example, the TCL 630 includes a nickel layer with a thickness not more than 50 angstroms and an indium tin oxide (ITO) layer, wherein the nickel layer may be disposed between the ITO layer and the first doped layer 612. The TCL in the following embodiments may also use this two-layer structure. Moreover, the first electrode 611 and the second electrode 616 is disposed on a same side of the light emitting chip 610. In this embodiment, the substrate 615 is an insulation substrate disposed between the magnetic submount 620 and the semiconductor stack structure, and the magnetic submount 620 does not directly contact the semiconductor stack structure.

In this embodiment, the magnetic submount 620 applies a magnetic field about perpendicular to the first doped layer 612, the second doped layer 614, and the active layer 613. In an embodiment, the magnetic field may be substantially perpendicular to the first doped layer 612, the second doped layer 614, and the active layer 613. In addition, in this embodiment, the magnetic submount 620 has a size lager than a size of the first electrode 611 and larger than a size of the second electrode 616. For example, the area of the magnetic submount 620 in the direction parallel to the active layer 613 is larger than the area of the first electrode 611 in the direction parallel to the active layer 613 and larger than the area of the second electrode 616 in the direction parallel to the active layer 613. Furthermore, in this embodiment, the area of the magnetic submount 620 in the direction parallel to the active layer 613 is larger than an area of the semiconductor stack structure in the direction parallel to the active layer 613. In this embodiment, the thickness T of the magnetic submount 620 is larger than 1 millimeter.

Figure 11:
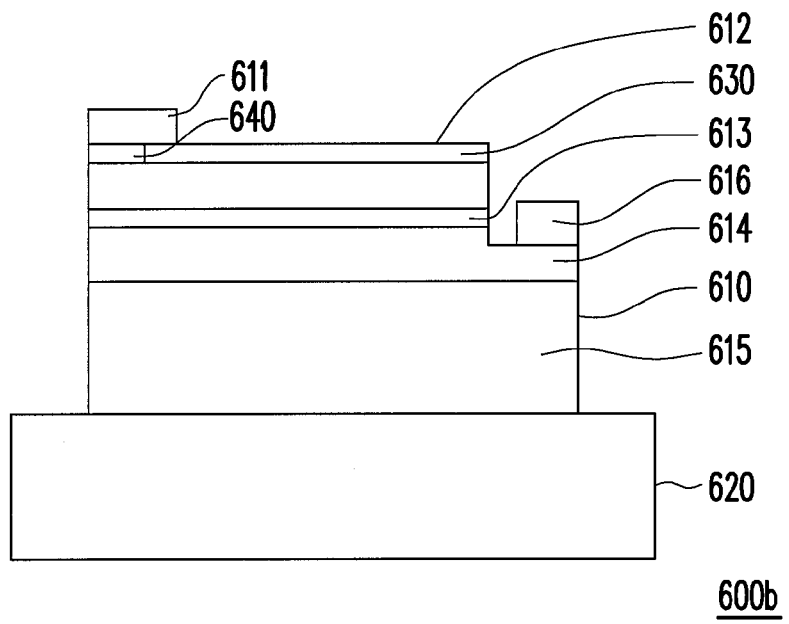
FIG. 11 is a cross-sectional diagram illustrating a structure of a light emitting device according to one embodiment of the disclosure.

In one embodiment of the disclosure, a transparent conductive layer and a block layer are further disposed in the light emitting device to enhance the brightness thereof FIG. 11 is a cross-sectional diagram illustrating a structure of a light emitting device according to one embodiment of the disclosure. Referring to FIG. 11, in the light emitting device 600b of the present embodiment, a transparent conductive layer 630 is further disposed above the first doped layer 612 as described in the previous embodiment, so as to reduce the effect of current crowding. Moreover, a block layer 640 is also disposed between the first electrode 611 and the first doped layer 612 for blocking a part of the electrical connection between the first electrode 611 and the first doped layer 612. Accordingly, the block layer 640 blocks most current paths under the first electrode 611 and only leaves a small gap for the current to flow out, such that the main distribution of current density is moved from an area under the first electrode 611 to an area under the light-out plane, thus increasing the brightness of the light emitting device 600b.

Figure 12:
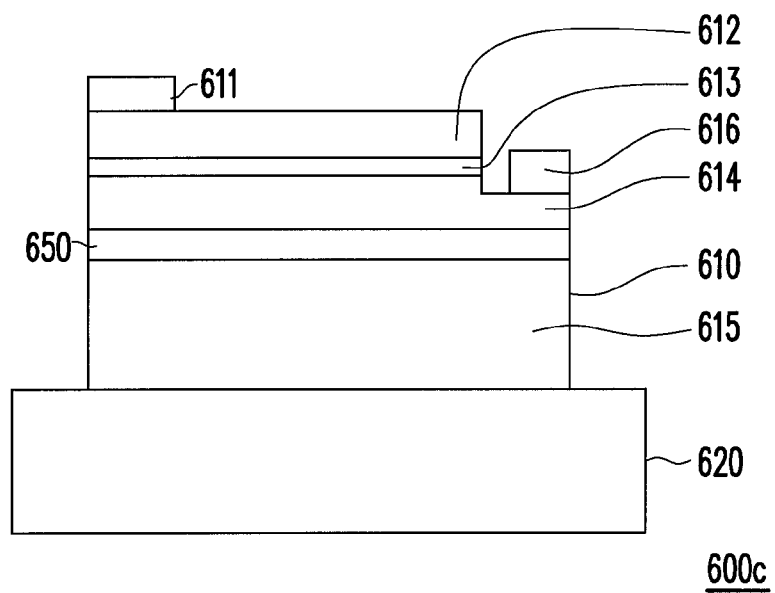
FIG. 12 is a cross-sectional diagram illustrating a structure of a light emitting device according to one embodiment of the disclosure.

In one embodiment of the disclosure, an isolating layer is further disposed in the light emitting device to enhance the brightness thereof FIG. 12 is a cross-sectional diagram illustrating a structure of a light emitting device according to one embodiment of the disclosure. Referring to FIG. 12, in the light emitting device 600c of the present embodiment, an isolating layer 650 is further disposed between the second doped layer 614 and the substrate 615 as described in the previous embodiment. Similar to the effect of block layer 640, the isolating layer 650 blocks most current paths between the second doped layer 614 and the substrate 615, such that the main distribution of current density is moved to an area under the light-out plane, thus increasing the brightness of the light emitting device 600c.

Figure 13:
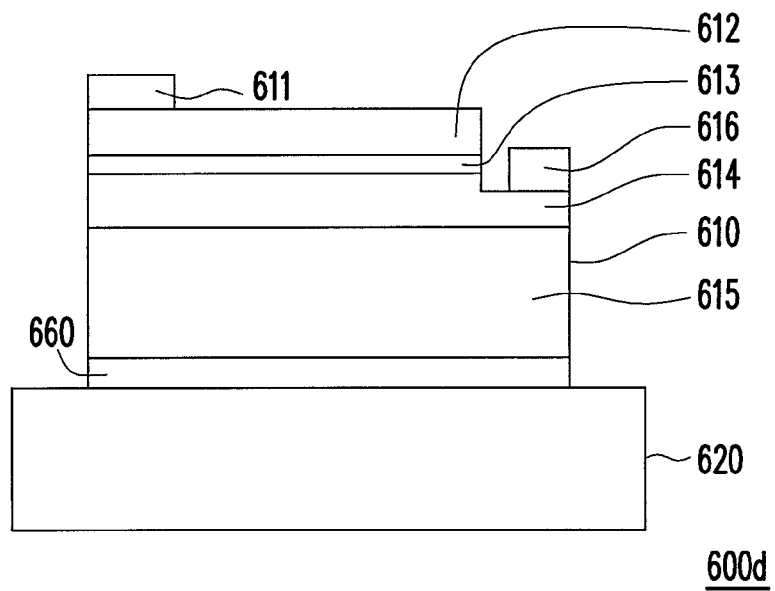
FIG. 13 is a cross-sectional diagram illustrating a structure of a light emitting device according to one embodiment of the disclosure.

In one embodiment of the disclosure, a mirror layer is further disposed in the light emitting device to enhance the brightness thereof FIG. 13 is a cross-sectional diagram illustrating a structure of a light emitting device according to one embodiment of the disclosure. Referring to FIG. 13, in the light emitting device 600d of the present embodiment, a mirror layer 660 is further disposed between the substrate 615 and the magnetic submount 620 for reflecting the light emitted from the active layer 613, so as to increase the brightness of the light emitting device 600d. It should be noted herein that, in other embodiments, the mirror layer 660 may also be disposed between second doped layer 614 and the substrate 615 for reflecting light, but not limited to them.

Figure 14:
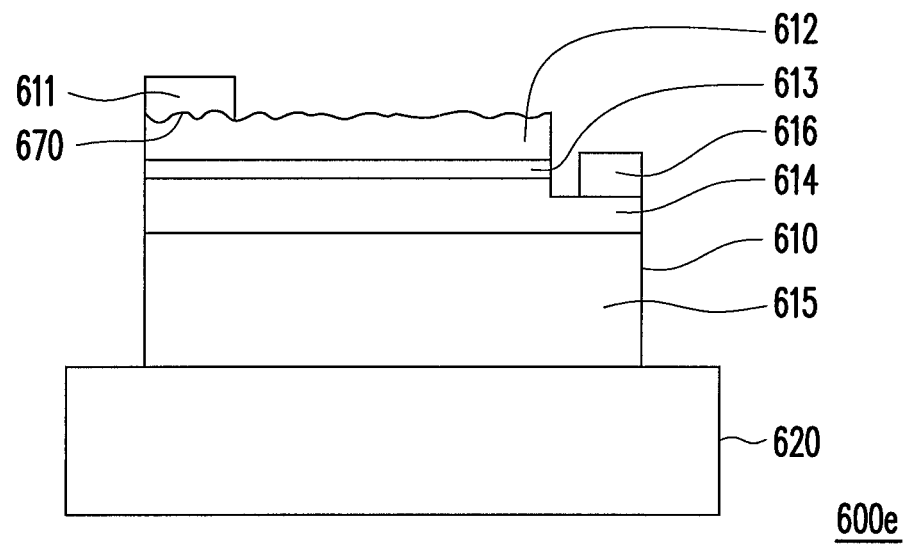
FIG. 14 is cross-sectional diagram illustrating a structure of a light emitting device according to one embodiment of the disclosure.

In one embodiment of the disclosure, a roughness pattern, a trapezoid pattern, a round pattern, or a photonic crystal layer is further fabricated to enhance the brightness of the light emitting device. FIG. 14 is a cross-sectional diagram illustrating a structure of a light emitting device according to one embodiment of the disclosure. Referring to FIG. 14, in the light emitting device 600e of the present embodiment, a roughness pattern 670 is fabricated on a top surface of the first doped layer 612 to increase the surface reflectivity of the first doped layer 612. Moreover, the roughness pattern may be fabricated on the top surface of the substrate 615 (or the bottom surface of the second doped layer 614) to increase the surface reflectivity of the substrate 615, or fabricated on the top surface of the magnetic submount 620 (or the bottom surface of the substrate 615) to increase the surface reflectivity of the magnetic submount 620. It should be noted herein that the roughness pattern as described above, a trapezoid pattern, a round pattern, or a photonic crystal layer may be fabricated on one of, or parts of, or all of the top surfaces and the bottom surfaces of the first doped layer 612, the second doped layer 614, the first electrode 611, the substrate 615, the magnetic submount 620, and the combination thereof, which is not limited to them.

Figure 15:
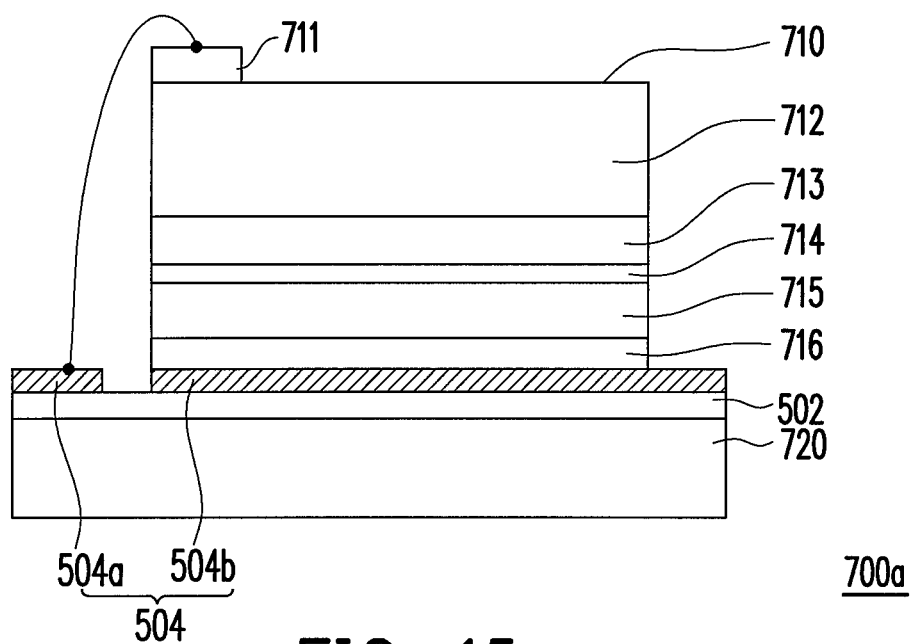
FIG. 15 is a cross-sectional diagram illustrating a structure of a light emitting device according to one embodiment of the disclosure.

As for a flip chip LED having a vertical type structure, FIG. 15 is a cross-sectional diagram illustrating a structure of a light emitting device according to one embodiment of the disclosure. Referring to FIG. 15, the light emitting device 700a of this embodiment is similar to the light emitting device 500a according to the embodiment of FIG. 5A, and the difference between the light emitting device 700a and the light emitting device 500a is as follows. The light emitting device 700a of the present embodiment is a vertical type LED, which includes a light emitting chip 710 and a magnetic submount 720. The light emitting chip 710 is disposed on the magnetic submount 720 through an epoxy, a metal bonding, a wafer bonding, epitaxy embeding, or a coating process.

The light emitting chip 710 includes, from top to bottom, a first electrode 711, a substrate 712, a first doped layer 713, an active layer 714, a second doped layer 715, and a second electrode 716, in which the first doped layer 713, the active layer 714, and the second doped layer 715 form a light emitting stacking layer, which is disposed under the substrate 712. The first electrode 711 is disposed on the first doped layer 713 and electrically coupled to the first doped layer 713, and the second electrode 716 is disposed under the second doped layer 715 and electrically coupled to the second doped layer 715, so as to form a vertical type LED structure. The active layer 714 is disposed between first electrode 711 and the second electrode 716, and capable of generating light when a current flows through it.

The magnetic field induced by the magnetic submount 720 is exerted on the light emitting chip 710, such that the main distribution of current density in the light emitting chip 710 is moved from an area between the first electrode 711 and the second electrode 715 to an area under the light-out plane, so as to enhance the current homogeneity and increase an overall brightness of the light emitting device 700a.

Figure 16:
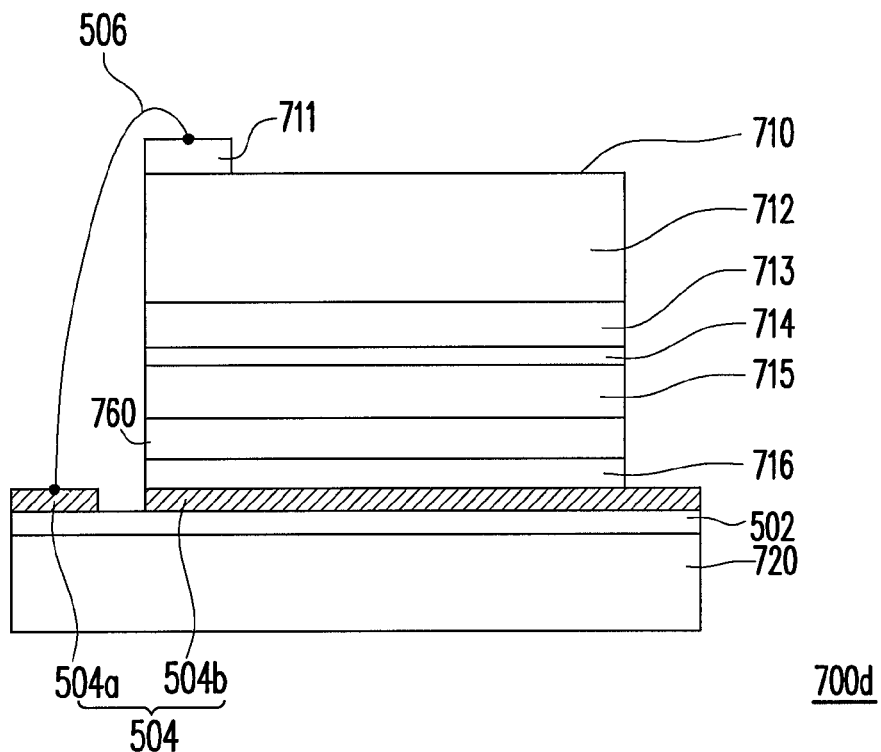
FIG. 16 is a cross-sectional diagram illustrating a structure of a light emitting device according to one embodiment of the disclosure.

In one embodiment of the disclosure, a mirror layer is further disposed in the light emitting device to enhance the brightness thereof. FIG. 16 is a cross-sectional diagram illustrating a structure of a light emitting device according to one embodiment of the disclosure. Referring to FIG. 16, the light emitting device 700d of this embodiment is similar to the light emitting device 500a according to the embodiment of FIG. 5A, and the difference between the light emitting device 700d and the light emitting device 500a is as follows. In the light emitting device 700d of the present embodiment, a mirror layer 760 is further disposed between the second doped layer 715 and the second electrode 516 for reflecting the light emitted from the active layer 714, so as to increase the brightness of the light emitting device 700d. It should be noted herein that, in other embodiments, the mirror layer 760 may also be disposed between the second electrode 716 and the magnetic submount 720 for reflecting light, but not limited to it.

Figure 17:
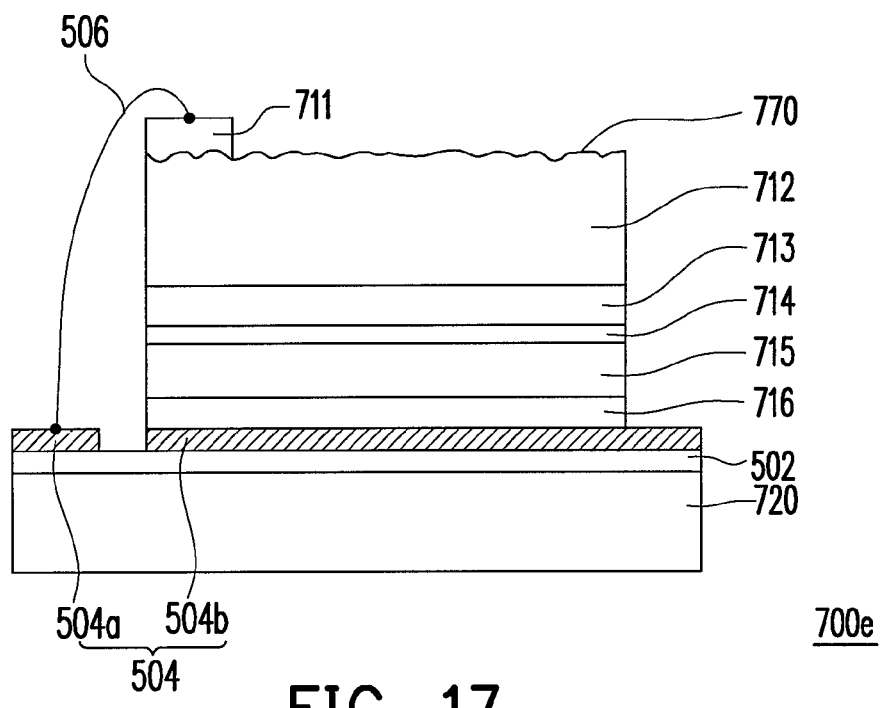
FIG. 17 is a cross-sectional diagram illustrating a structure of a light emitting device according to one embodiment of the disclosure.

In one embodiment of the disclosure, a roughness pattern, a trapezoid pattern, a round pattern, or a photonic crystal layer is further fabricated to enhance the brightness of the light emitting device. FIG. 17 is a cross-sectional diagram illustrating a structure of a light emitting device according to one embodiment of the disclosure. Referring to FIG. 17, the light emitting device 700e of this embodiment is similar to the light emitting device 500a according to the embodiment of FIG. 5A, and the difference between the light emitting device 700e and the light emitting device 500a is as follows. In the light emitting device 700e of the present embodiment, a roughness pattern 770 is fabricated on a top surface of the substrate 712 to increase the surface reflectivity of the substrate 712. Moreover, the roughness pattern may be fabricated on the top surface of the first doped layer 713 (or the bottom surface of the substrate 712) to increase the surface reflectivity of the first doped layer 713, or fabricated on the top surface of the second electrode 716 (or the bottom surface of the second doped layer 715) to increase the surface reflectivity of the second electrode 716. It should be noted herein that the roughness pattern as described above, a trapezoid pattern, a round pattern, or a photonic crystal layer may be fabricated on one of, or parts of, or all of the top surfaces and the bottom surfaces of the substrate 712, the first doped layer 713, the second doped layer 715, the first electrode 711, the second electrode 716, the magnetic submount 720, and the combination thereof, which is not limited to them.

Figure 18:
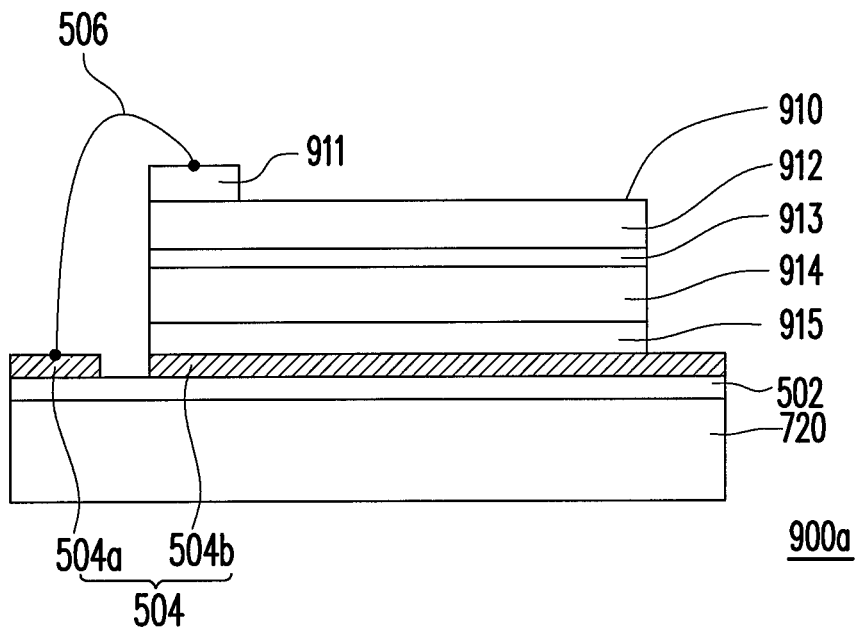
FIG. 18 is a cross-sectional diagram illustrating a structure of a light emitting device according to one embodiment of the disclosure.

As for a thin film LED having a vertical type structure, FIG. 18 is a cross-sectional diagram illustrating a structure of a light emitting device according to one embodiment of the disclosure. Referring to FIG. 18, the light emitting device 900a of this embodiment is similar to the light emitting device 500a according to the embodiment of FIG. 5A, and the difference between the light emitting device 900a and the light emitting device 500a is as follows. The light emitting device 900a of the present embodiment is a vertical type LED, which includes a light emitting chip 910 and a magnetic submount 920. The light emitting chip 910 is disposed on the magnetic submount 920 through an epoxy, a metal bonding, a wafer bonding, epitaxy embeding, or a coating process.

The light emitting chip 910 includes, from top to bottom, a first electrode 911, a first doped layer 912, an active layer 913, a second doped layer 914, and a second electrode 915, in which the first doped layer 912, the active layer 913, and the second doped layer 914 form a light emitting stacking layer. The first electrode 911 is disposed on the first doped layer 912 and electrically coupled to the first doped layer 912, and the second electrode 915 is disposed under the second doped layer 914 and electrically coupled to the second doped layer 914, so as to form a vertical type LED structure. The active layer 913 is disposed between first electrode 911 and the second electrode 915, and capable of generating light when a current flows through it.

The magnetic field induced by the magnetic submount 920 is exerted on the light emitting chip 910, such that the main distribution of current density in the light emitting chip 910 is moved from an area between the first electrode 911 and the second electrode 915 to an area under the light-out plane, so as to enhance the current homogeneity and increase an overall brightness of the light emitting device 900a.

Figure 19:
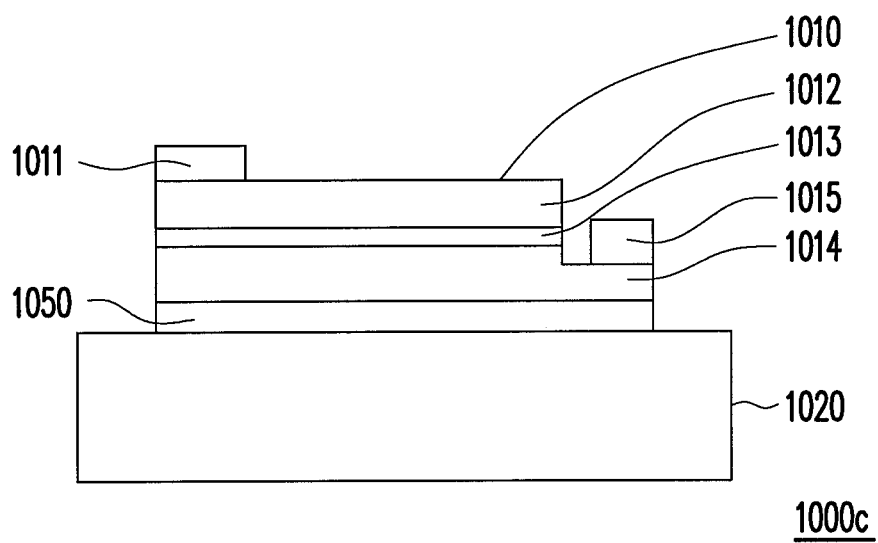
FIG. 19 is a cross-sectional diagram illustrating a structure of a light emitting device according to one embodiment of the disclosure.

In one embodiment of the disclosure, an isolating layer is further disposed in the light emitting device to enhance the brightness thereof. FIG. 19 is a cross-sectional diagram illustrating a structure of a light emitting device according to one embodiment of the disclosure. Referring to FIG. 19, in the light emitting device 1000c of the present embodiment, an isolating layer 1050 is further disposed between the second doped layer 1014 and the magnetic submount 1020 as described in the previous embodiment. Similar to the effect of block layer 1040, the isolating layer 1050 blocks most current paths between the first electrode 1011 and the magnetic submount 1020, such that the main distribution of current density is moved to an area under the light-out plane, thus increasing the brightness of the light emitting device 1000c.

Figure 20:
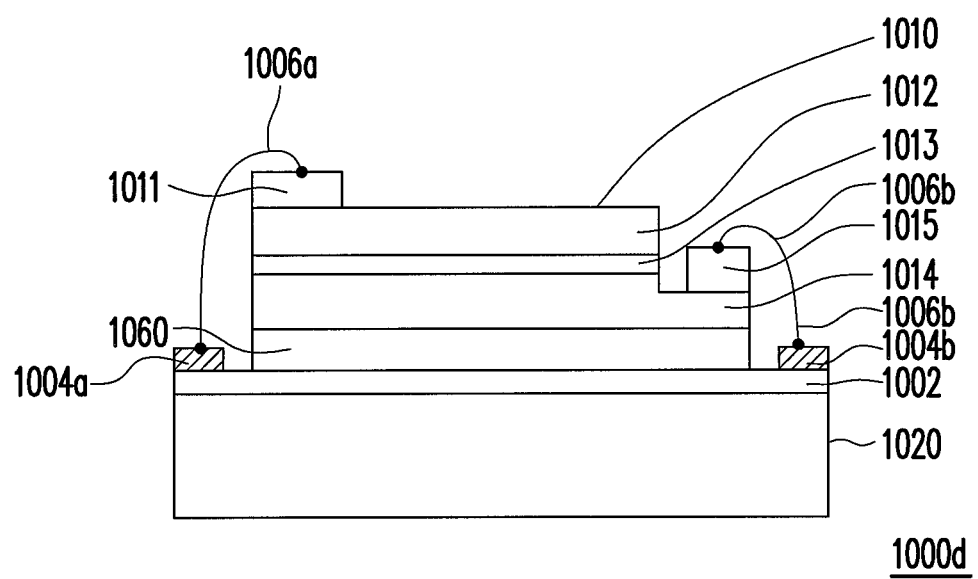
FIG. 20 is a cross-sectional diagram illustrating a structure of a light emitting device according to one embodiment of the disclosure.

In one embodiment of the disclosure, a mirror layer is further disposed in the light emitting device to enhance the brightness thereof. FIG. 20 is a cross-sectional diagram illustrating a structure of a light emitting device according to one embodiment of the disclosure. Referring to FIG. 20, in the light emitting device 1000d of the present embodiment, a mirror layer 1060 is further disposed between the second doped layer 1014 and the magnetic submount 1020 for reflecting the light emitted from the active layer 1013, so as to increase the brightness of the light emitting device 1000d.

In this embodiment, an insulation layer 1002 is disposed between the magnetic submount 1020 and the mirror layer 1060. A first circuit 1004a is disposed on the insulation layer 1002 and electrically connected to the first electrode 1011 through a bonding wire 1006a. A second circuit 1004b is disposed on the insulation layer 1002 and electrically connected to the second electrode 1015 through a bonding wire 1006b. The material of the bonding wires 1006a and 1006b is, for example, gold (Au), gold-tin alloy (AuSn), lead-tin alloy (PbSn), or other suitable metals.

Figure 21:
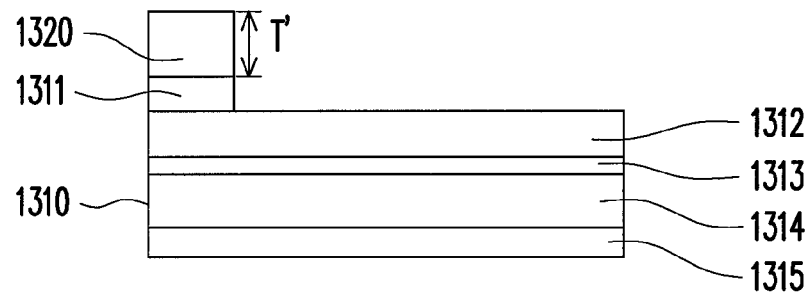
FIG. 21(a)~FIG. 21(c) are cross-sectional diagrams illustrating a structure of a light emitting device according to one embodiment of the disclosure.
Figure 21:
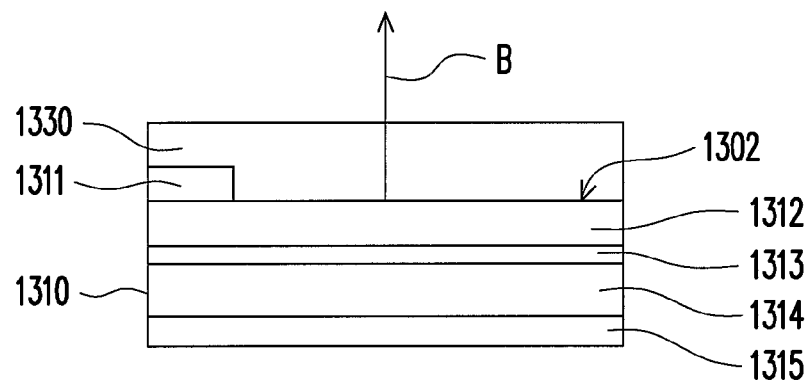
Figure 21:
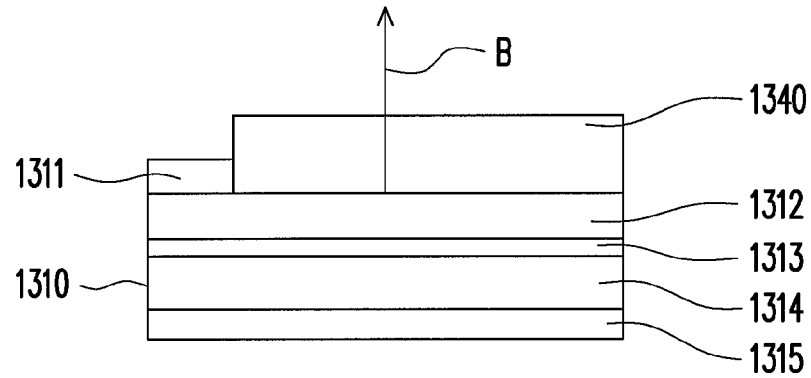

As for a LED having a vertical type structure and having a magnetic material disposed thereon, FIG. 21(a)~FIG. 21(c) are cross-sectional diagrams illustrating a structure of a light emitting device according to one embodiment of the disclosure. Referring to FIG. 21(a), the light emitting device 1300a of the present embodiment is a vertical type LED, which includes a light emitting chip 1310 and a magnetic material 1320. The light emitting chip 1310 includes, from top to bottom, a first electrode 1311, a first doped layer 1312, an active layer 1313, a second doped layer 1314, and a second electrode 1315, in which the first doped layer 1312, the active layer 1313, and the second doped layer 1314 form a light emitting stacking layer. The first electrode 1311 is disposed on the first doped layer 1312 and electrically coupled to the first doped layer 1312, and the second electrode 1315 is disposed under the second doped layer 1314 and electrically coupled to the second doped layer 1314, so as to form a vertical type LED structure. The active layer 1313 is disposed between first electrode 1311 and the second electrode 1316, and capable of generating light when a current flows through it.

The magnetic material 1320 is disposed on the first electrode 1311 and exerts a magnetic field on the light emitting chip 1310, such that the main distribution of current density in the light emitting chip 1310 is moved from an area between the first electrode 1311 and the second electrode 1315 to an area under the light-out plane, so as to enhance the current homogeneity and increase an overall brightness of the light emitting device 1300a. In this embodiment, the thickness T' of the magnetic material 1320 in a direction perpendicular to the active layer 1313 is larger than 1 millimeter.

In other embodiments, the magnetic material may be disposed on the light emitting stacking layer and covers the first electrode (magnetic material 1330, as shown in FIG. 21(b)), or disposed on a surface of the light emitting stacking layer uncovered by the first electrode (magnetic material 1340, as shown in FIG. 21(c)). In FIGS. 21(b) and 21(c), each of the magnetic material 1330 and 1340 is a magnetic film covering the light emitting surface 1302 of the semiconductor stack structure, and light B emitted from the active layer 1313 passes through the light emitting surface 1302 and the magnetic film and is then transmitted to the outside of the light emitting device 1300b, 1300c.

Figure 22:
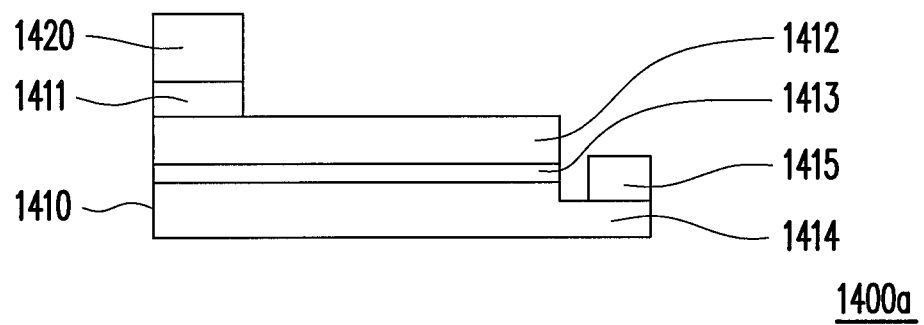
FIG. 22 is a cross-sectional diagram illustrating a structure of a light emitting device according to one embodiment of the disclosure.

As for a LED having a horizontal type structure and having a magnetic material disposed thereon, FIG. 22 is cross-sectional diagram illustrating a structure of a light emitting device according to one embodiment of the disclosure. Referring to FIG. 22, the light emitting device 1400a of the present embodiment is a horizontal type LED, which includes a light emitting chip 1410 and a magnetic material 1420. The light emitting chip 1410 includes, from top to bottom, a first electrode 1411, a first doped layer 1412, an active layer 1413, and a second doped layer 1414, in which the first doped layer 1412, the active layer 1413, and the second doped layer 1414 form a light emitting stacking layer. The first electrode 1411 is disposed on the first doped layer 1412 and electrically coupled to the first doped layer 1412, and the second electrode 1416 is disposed on a surface of the second doped layer 1414 uncovered by the active layer 1413 and electrically coupled to the second doped layer 1414, so as to form a horizontal type LED structure. The active layer 1413 is disposed between first electrode 1411 and the second electrode 1415, and capable of generating light when a current flows through it.

The magnetic material 1420 is disposed on the first electrode 1411 and exerts a magnetic field on the light emitting chip 1410, such that the main distribution of current density in the light emitting chip 1410 is moved from an area between the first electrode 1411 and the second electrode 1415 to an area under the light-out plane, so as to enhance the current homogeneity and increase an overall brightness of the light emitting device 1400a.

In other embodiments, the magnetic material may be disposed on the light emitting stacking layer and covers the first electrode, or disposed on a surface of the light emitting stacking layer uncovered by the first electrode. In yet other embodiments, the magnetic material may be disposed on the second electrode (not shown), which is not limited thereto.

It should be noted herein that, with the external energy field applied to the light emitting device, not only the current path is changed, but also the homogeneity of the carrier density in the semiconductor is altered. Accordingly, the light emitting device has a higher efficiency for optoelectronic transformation even though the amount of injected current remains unchanged.

Figure 23:
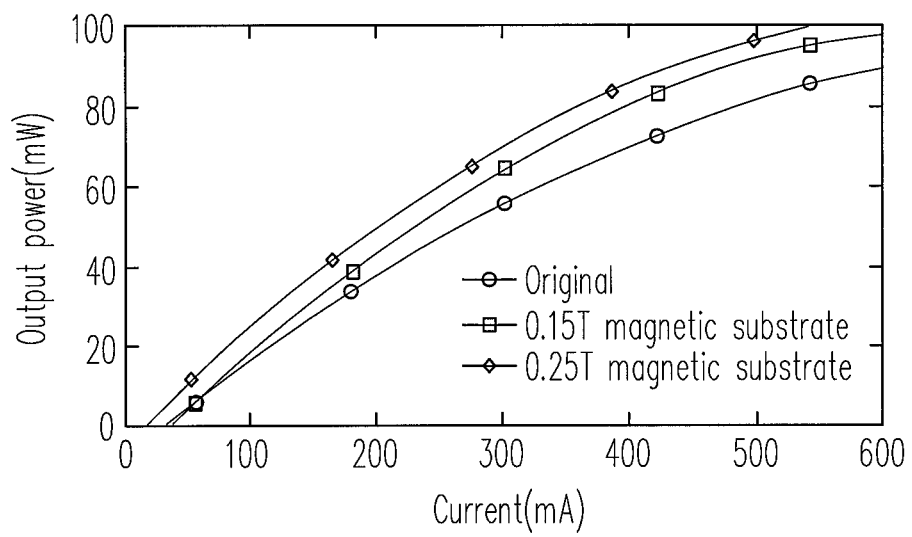
FIG. 23 is a graph showing the output power of the light emitted by the light emitting device having the magnetic substrate according to one embodiment of the disclosure.

FIG. 23 is a graph showing the output power of the light emitted by the light emitting device having the magnetic substrate according to one embodiment of the disclosure, where x coordinate refers to the current injected into the light emitting device and y coordinate refers to the output power of light emitted by the light emitting device. Referring to FIG. 23, the efficiency of optoelectronic transformation is raised by 0.025 mW/mA and an overall output power of light is enhanced by 15 percent as a 0.15T magnetic field is added to the light emitting device. On the other hand, the efficiency of optoelectronic transformation is raised by 0.04 mW/mA and an overall output power of light is enhanced by 22.6 percent as a 0.25T magnetic field is added to the light emitting device. As shown in FIG. 23, apparently, the output power of light is enhanced when the strength of the external magnetic field is increased.

Figure 24:
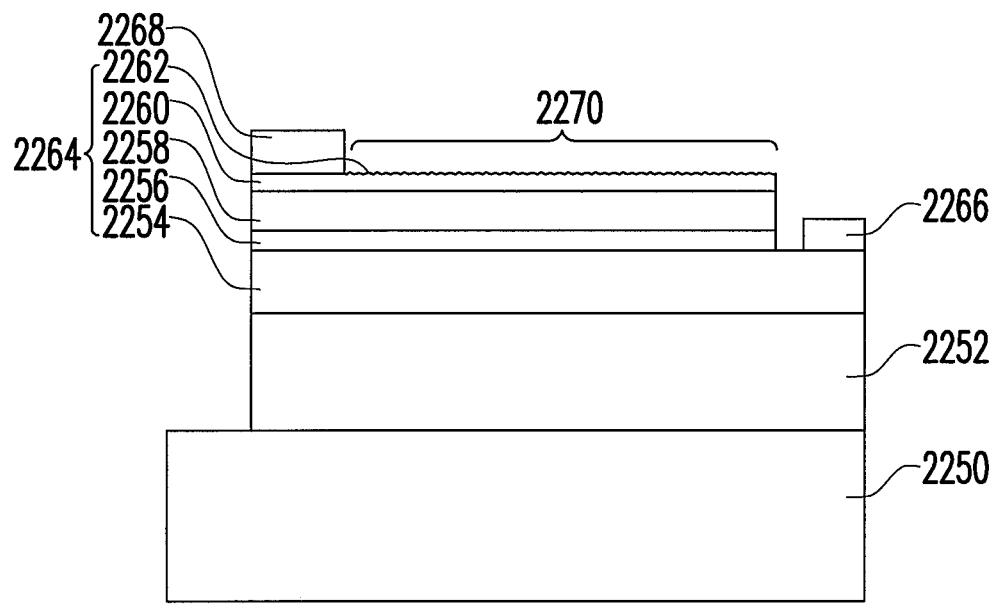
FIGS. 24, 25, 26, 27A, and 28 are cross-sectional views, schematically illustrating structures of light emitting device, according to embodiments of the disclosure.

FIGS. 24-28 are cross-sectional views, schematically illustrating structures of light emitting device, according to embodiments of the disclosure. In FIG. 24, a light-emitting structure can include the basic structure 2264, disposed on a substrate 2252. The basic structure 2264 can include, for example, a bottom doped layer 2254, which can be organic/in-organic semiconductor or any suitable doped materials used for emitting light. The basic structure 2264 may include, for example, a bottom doped stack layer 2254, an active layer 2256, an upper doped stack layer 2258. Here, the bottom doped stack layer 2254 and the upper doped stack layer 2258 are in different conductive types. However, depending on the operation voltage, the bottom doped stack layer 2254 or the upper doped stack layer 2258 can be p-type or n-type. In addition, due to for example the relative poor contact between the electrode and the doped semiconductor material, the transparent conductive layer (TCL) 2260 may also included, for example. In addition, in order to have better performance of light output in the light emitting area 2270, a rough surface 2262 can be formed, which is for example formed on the TCL 2260 or on the upper doped stack layer 2258. Actually, the rough surface 2262 can be at any proper surface depending on the light output direction. The two electrodes 2266 and 2268, respectively disposed on the bottom doped stack layer 2254 and the upper doped stack layer 2258, are at the same side of the light-emitting structure, that is also called horizontal-type light emitting device. In this horizontal design, there is a horizontal component of driving current in the upper doped stack layer 2258 or even in the TCL 2260 if the TCL is included. Particularly, the basic structure 2264 is thin film design to reduce the thickness, and then the horizontal component of the driving current is relative large.

Figure 1:
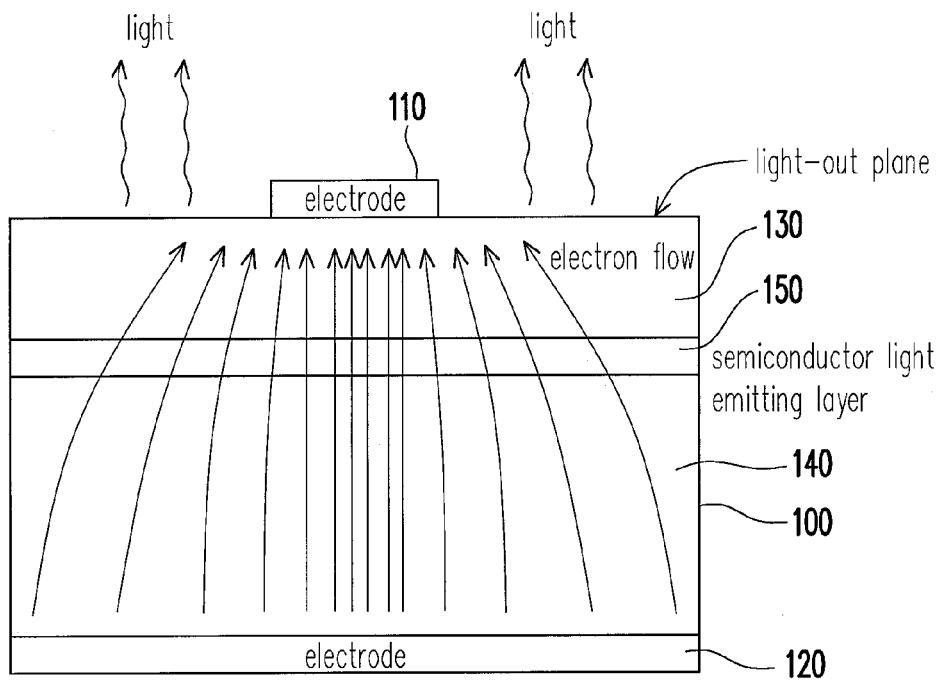
FIG. 1 is a schematic diagram illustrating a cross-sectional view of a conventional vertical light emitting device.
Figure 2:
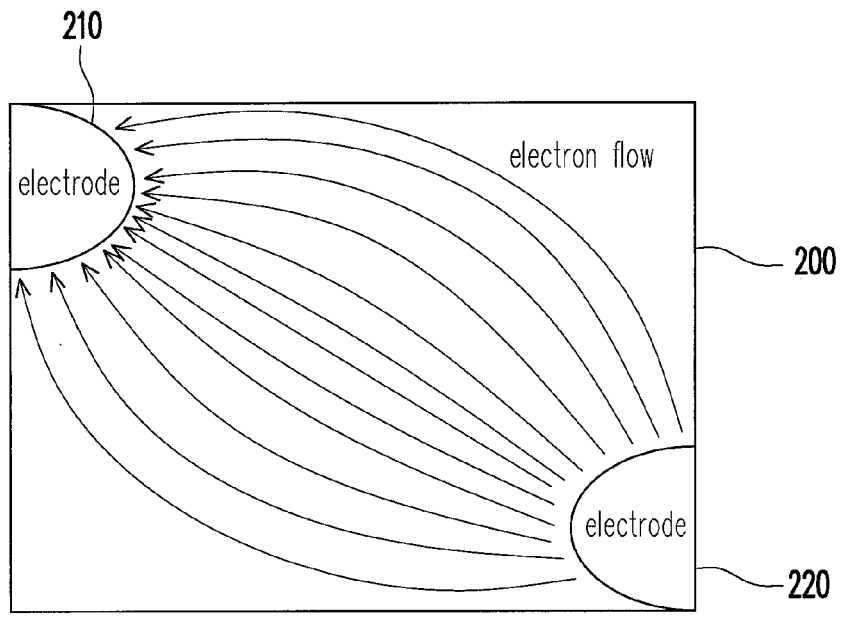
FIG. 2 is a schematic diagram illustrating a top view of a conventional horizontal light emitting device.

In the disclosure, a magnetic-source layer 2250 is additional added and is implemented on the substrate 2252 at the other side. In this embodiment, the substrate 2252 is, for example, an insulation substrate. The magnetic-source layer 2250 is used to produce a magnetic field so as to redistribute the current density of the horizontal component in the upper doped stack layer 2258, based on the mechanism of FIG. 2B. The magnetic-source layer 2250 can, for example, be an artificial ferromagnetic layer with the magnetization to provide a magnetic field substantially perpendicular to the light emitting area 2270, so as to redistribute the current density of the horizontal component. The locations of the electrodes 2266 and 2268 are set in accordance the magnetic field be produced. It can be understood that the magnetic-source layer 2250 is used to produce the intended magnetic field for shift the driving current, and any proper modified design can be implemented. The magnetic-source layer 2250 can also serves as another substrate. Even for example, the magnetic-source layer 2250 can be an external structure or unit without physically contact. In other words, magnetic-source layer 2250 can an external unit for applying the magnetic field or an integrated structure layer in the light emitting structure.

Figure 25:
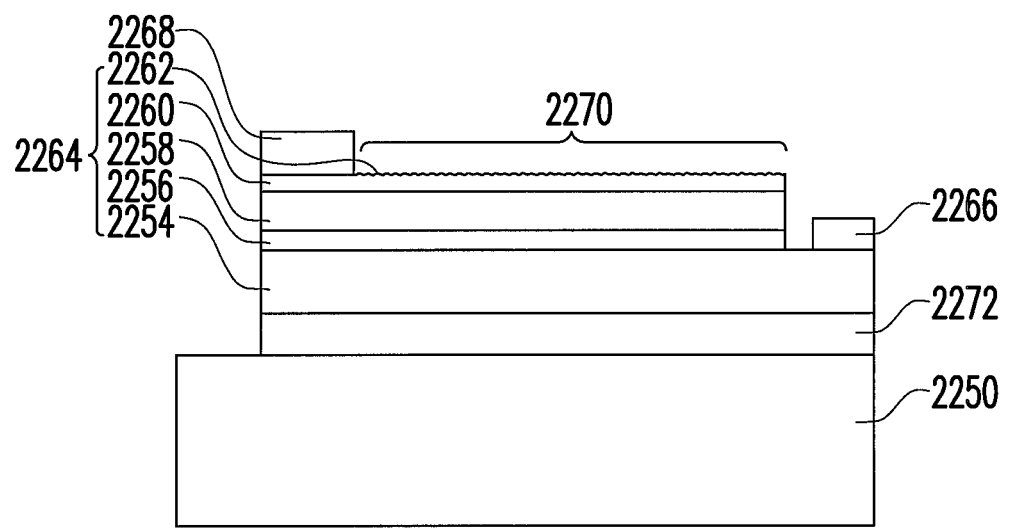
Figure 26:
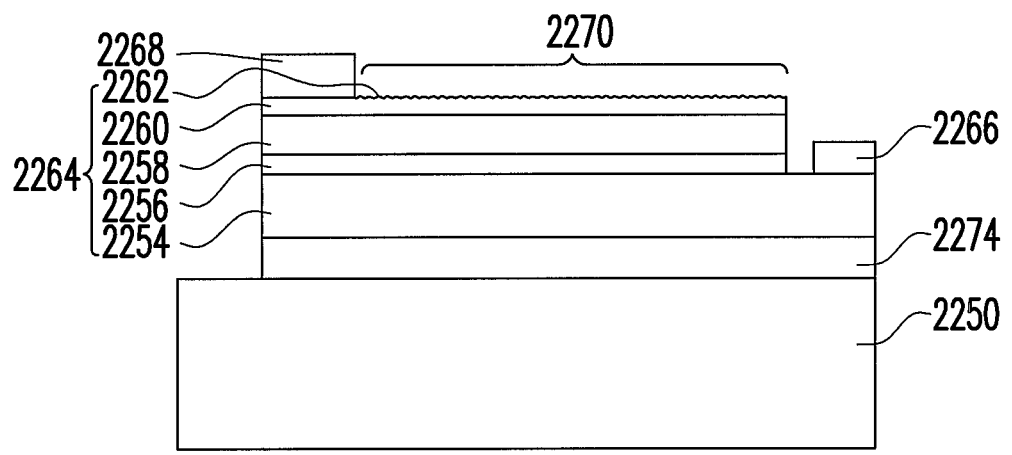

Based on the same concept of the mechanism, the structure in FIG. 24 can be modified as shown in FIG. 25, for example. In FIG. 25, the substrate 2252 in FIG. 24 can be changed as a reflection layer 2272. The reflection layer 2272 can be, for example, a metal layer or made by other manner to form the reflection property. The light output can be increased. In FIG. 26, even further, the reflection layer 2272 can be, for example, replaced by insulating layer, substrate with reduced thickness or reflection layer in reduced thickness. It can be understood that the embodiments in FIGS. 24-26 are just the examples. The disclosure is not jest limited to the embodiments.

In foregoing embodiments, the magnetic-source layer 2250 is implemented at the bottom. However, the magnetic-source layer 2250 can be implemented at the upper side. Since the surface level at the upper side of the light emitting structure is usually not planar, the magnetic-source layer can be implemented by, for example, packaging manner.

Figure 27A:
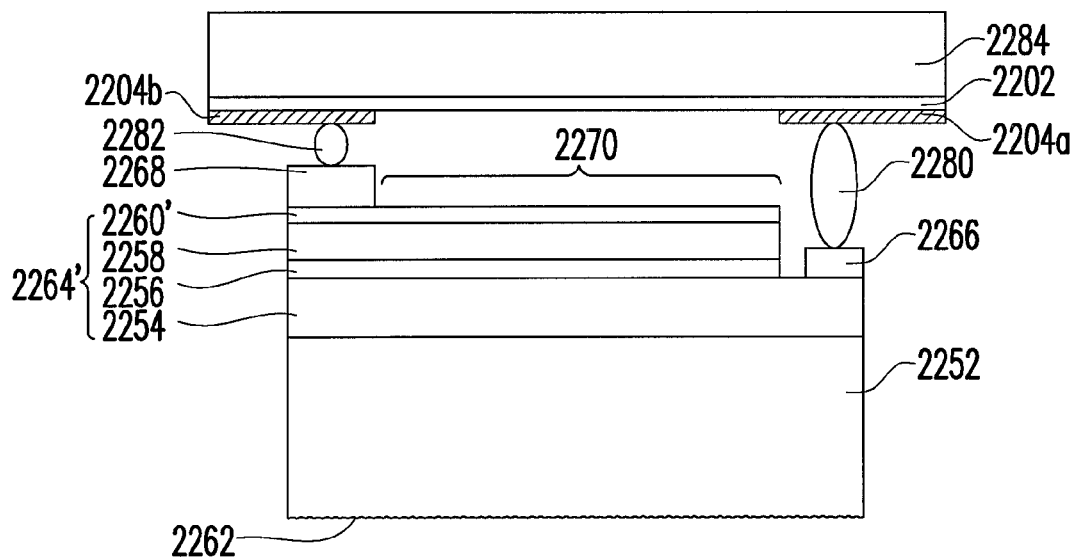
Figure 27B:
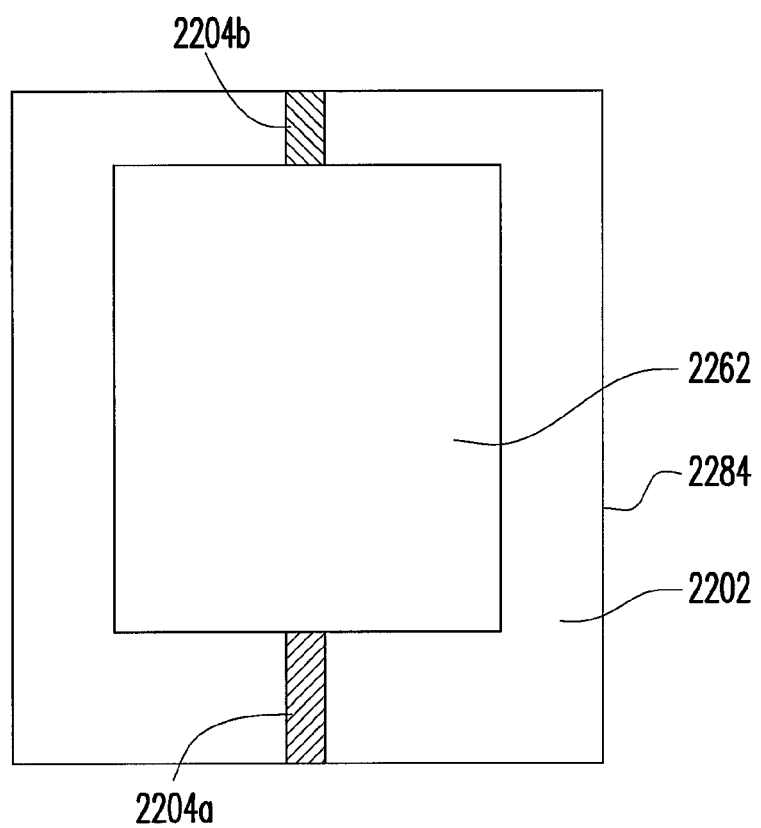
FIG. 27B is a schematic top view of the light emitting device of FIG. 27A.

FIG. 27A is a schematic cross-sectional view of a light emitting device according to another exemplary embodiment, and 27B is a schematic top view of the light emitting device of FIG. 27A. In FIGS. 27A and 27B, the magnetic-source layer 2284 can be implemented by bonding bump 2280 and 2282 by flip-chip packaging process, known in the art. The material of the bump 2280, 2282 is, for example, gold (Au), gold-tin alloy (AuSn), lead-tin alloy (PbSn), solder, or other suitable metals. Here, when considering the light output direction, which is toward the transparent substrate 2252, the rough surface 2262 can be formed on the outer surface of the substrate 2252 and a reflection layer 2260', such as a metal layer, can be implemented in the basic structure 2264'. However, it is not the only packaging manner to implement the magnetic-source layer 2284.

Alternatively, for example, the bonding bump 2280 and 2282 can be omitted, and the electrodes 2266 and 2268 can be fabricated to have the same height by, for example, plating or any proper semiconductor fabrication process. Because the electrodes 2266 and 2268 have the same height, the magnetic-source layer 2284 can then be directly adhered to the electrode, for example. In other words, the magnetic-source layer 2284 can be formed by any proper manner.

In this embodiment, an insulation layer 2202 is disposed on the magnetic-source layer 2284. Moreover, a circuit 2204a is disposed between the bump 2280 and the insulation layer 2202, and electrically connected to the bump 2280. A circuit 2204b is disposed between the bump 2282 and the insulation layer 2202, and electrically connected to the bump 2282.

Even further for example, the structure in FIG. 27A can be combined with FIG. 24 by adding the magnetic-source layer 2250 at bottom, as well. As a result, two magnetic-source layers can be implemented.

Figure 28:
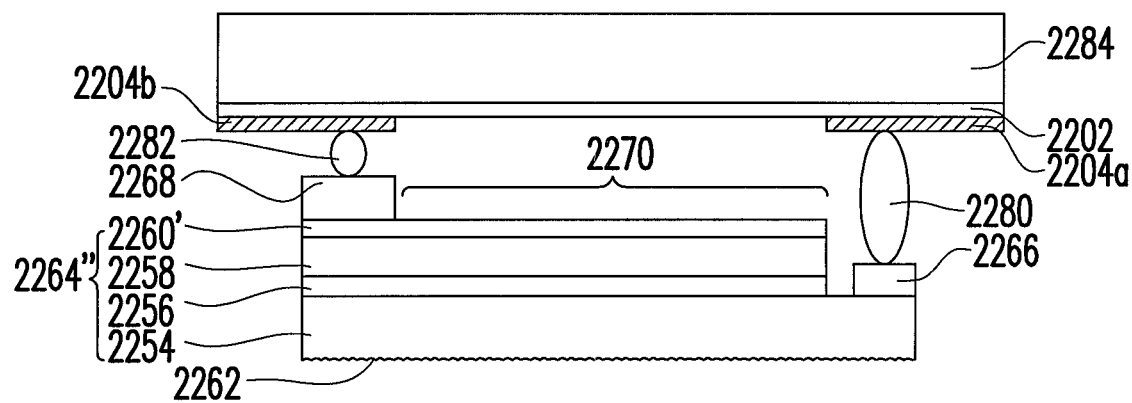

In FIG. 28, alternatively, the magnetic-source layer 2284 can also serve as the substrate. In this situation, the basic structure 2264" can be packaged with the magnetic-source layer 284 as previously described. Like FIG. 27A, the reflection layer 2260' is implemented in the basic structure 2264". In addition, the bottom doped layer 2254 has the rough surface 2262. As a result, the light can go through the rough surface 2262 in better performance.

Figure 29:
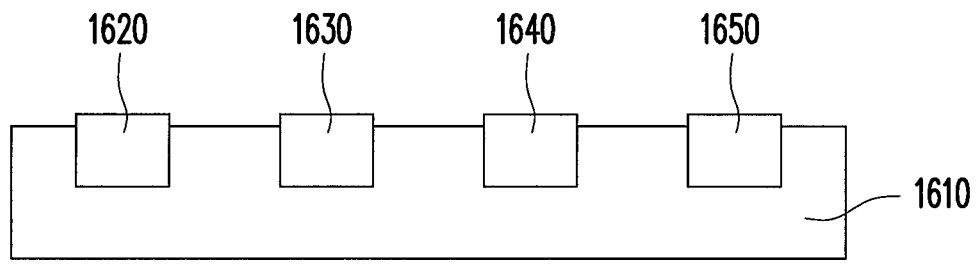
FIG. 29 is a cross-sectional diagram illustrating a structure of a light emitting device according to one exemplary embodiment.

FIG. 29 is a cross-sectional diagram illustrating a structure of a light emitting device according to one exemplary embodiment. Referring to FIG. 29, the magnetic material is fabricated into a submount 1610 and plural light emitting chips 1620~1650 are embedded in the submount 1610.

Figure 30:
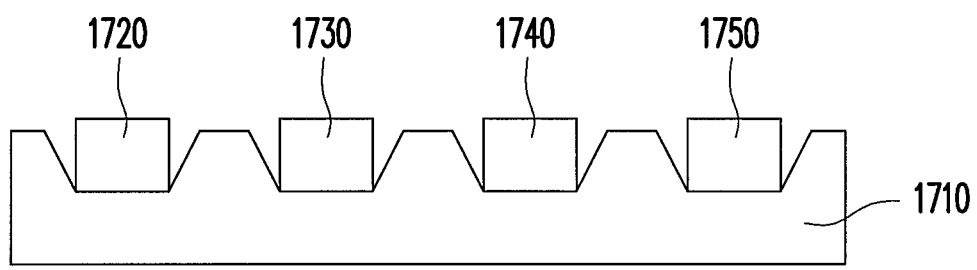
FIG. 30 is a cross-sectional diagram illustrating a structure of a light emitting device according to one exemplary embodiment.
Figure 31:
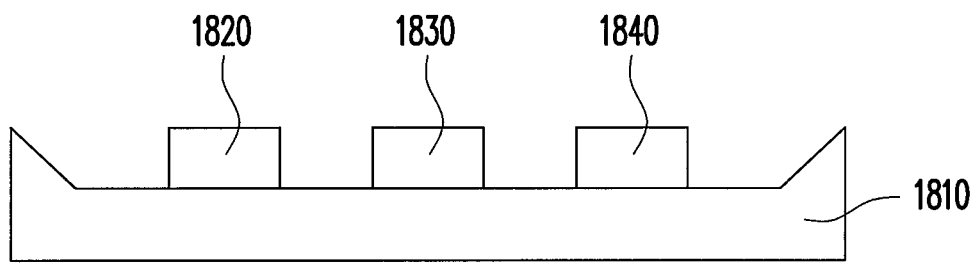
FIG. 31 is a cross-sectional diagram illustrating a structure of a light emitting device according to one exemplary embodiment.

In other embodiments, the magnetic material may be fabricated with one or a plurality of concaves for disposing the light emitting chips. FIG. 30 and FIG. 31 are cross-sectional diagrams illustrating structures of light emitting devices according to exemplary embodiments. Referring to FIG. 30, the magnetic material is fabricated into a submount 1710 having a plurality of concaves, each of which is disposed with one of the light emitting chips 1720~1750 and has a reflective surface for reflecting light emitted by the corresponding light emitting chip. Referring to FIG. 31, the magnetic material is fabricated into a submount 1810 having only one concave, which is disposed with the light emitting chips 1820~1840 and also has a reflective surface for reflecting light emitted by the light emitting chips 1820~1840. Accordingly, the light emitting efficiency of the light emitting device is enhanced not only by the effect of magnetic force but also by the effect of reflector, such that an overall brightness of the light emitting device is increased.

With the external energy field applied to the light emitting device, not only the current path is changed, but also the homogeneity of the carrier density in the semiconductor is altered. Accordingly, the light emitting device has a higher efficiency for optoelectronic transformation even though the amount of injected current remains unchanged.

As mentioned above, a plurality of structures of light emitting chip are used and disposed with a magnetic material, so as to enhance the brightness of the light emitting device. However, in another aspect, the magnetic material may be fabricated into a substrate, a submount, a magnetic film, an electromagnet, a slug, a holder, or a magnetic heat sink, the magnetic material may be ferromagnetic material such as Rb, Ru, Nd, Fe, Pg, Co, Ni, Mn, Cr, Cu, Cr2, Pt, Sm, Sb, Pt, or an alloy thereof, and the surface magnetic force thereof is larger than 0.01 Tesla, and the shape thereof can be a circle or a polygon.

Again, the foregoing embodiments are just the examples. In addition, all the embodiments can be properly combined into another embodiment.

To sum up, the magnetic field may be added to the light emitting device in the manners as described above, so as to enhance the light emitting efficiency and increase the luminance of the light emitting device. Accordingly, the disclosure at least has following advantages.

1. With the enhancement of the capability for spreading the drift current, the distance between the electrodes can be increased, such that the number of electrodes can be decreased and the size of the electrodes can be reduced. Accordingly, the light emitting area can be enlarged so as to enhance the light emitting efficiency of the light emitting device.

2. The amount of the spread drift current is increased, such that the main distribution with the highest current density is moved from the area between the electrodes of the light emitting device to the area under the light-out area so as to enhance current homogeneity. Accordingly, the area with highest efficiency of optoelectronic transformation is no longer blocked by the electrodes so as to enhance the light emitting efficiency of the light emitting device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting device, comprising:
   a light emitting chip, comprising:
      a first doped semiconductor layer;
      a second doped semiconductor layer; and
      a light emitting semiconductor layer disposed between the first doped semiconductor layer and the second doped semiconductor layer;
   a magnetic material disposed beside the light emitting chip, wherein the magnetic material is not disposed on a conducting path of a current causing the light emitting chip to emit light;
   an insulation layer disposed between the light emitting chip and the magnetic material, the insulation layer insulating the light emitting chip and the magnetic material; and
   a circuit layer disposed on the insulation layer, wherein the insulation layer insulates the circuit layer and the magnetic material, and the circuit layer comprises:
      a first circuit electrically connected to the first doped semiconductor layer; and
      a second circuit electrically connected to the second doped semiconductor layer.

2. The light emitting device according to claim 1, wherein the first doped semiconductor layer, the second doped semiconductor layer, and the light emitting semiconductor layer form a semiconductor stack structure, the light emitting device further comprises:
   a first electrode electrically connecting the first doped semiconductor layer and the first circuit; and
   a second electrode electrically connecting the second doped semiconductor layer, wherein the first electrode and the second electrode is disposed on a same side of the light emitting chip.

3. The light emitting device according to claim 2, further comprising:
   a first bump electrically connecting the first electrode and the first circuit; and
   a second bump electrically connecting the second electrode and the second circuit.

4. The light emitting device according to claim 1, wherein the first doped semiconductor layer, the second doped semiconductor layer, and the light emitting semiconductor layer form a semiconductor stack structure, the light emitting device further comprises:
   a first electrode electrically connecting the first doped semiconductor layer and the first circuit; and
   a second electrode electrically connecting the second doped semiconductor layer, wherein the first electrode and the second electrode is respectively disposed on opposite sides of the semiconductor stack structure.

5. The light emitting device according to claim 4, further comprising a bonding wire connecting the first electrode and the first circuit.

6. The light emitting device according to claim 1, wherein a thickness of the magnetic material in a direction perpendicular to the light emitting semiconductor layer is greater than 1 millimeter.

7. The light emitting device according to claim 6, further comprising:
a first electrode electrically connecting the first doped semiconductor layer, wherein the magnetic material is disposed on the first electrode; and
a second electrode electrically connecting the second doped semiconductor layer.

8. A light emitting device, comprising:
a light emitting chip, comprising:
a first doped semiconductor layer;
a second doped semiconductor layer; and
a light emitting semiconductor layer disposed between the first doped semiconductor layer and the second doped semiconductor layer; and
a magnetic material disposed beside the light emitting chip, wherein the magnetic material is not disposed on a conducting path of a current causing the light emitting chip to emit light, the light emitting chip has a light emitting surface, the magnetic material is a magnetic film covering the light emitting surface, and light emitted from the light emitting semiconductor layer passes through the light emitting surface and the magnetic film and is then transmitted to an outside of the light emitting device.

9. The light emitting device according to claim 8, wherein the light emitting chip further comprises:
a first electrode electrically connected to the first doped semiconductor layer, wherein the first electrode is disposed beside the light emitting surface and does not cover the light emitting surface, and the magnetic film dose not cover the first electrode; and
a second electrode electrically connected to the second doped semiconductor layer, wherein the first electrode and the second electrode are disposed on opposite sides of the light emitting chip.

10. The light emitting device according to claim 8, wherein the light emitting chip further comprises:
a first electrode electrically connected to the first doped semiconductor layer, wherein the first electrode is disposed beside the light emitting surface and does not cover the light emitting surface, and the magnetic film covers the first electrode; and
a second electrode electrically connected to the second doped semiconductor layer, wherein the first electrode and the second electrode are disposed on opposite sides of the light emitting chip.

11. The light emitting device according to claim 1, wherein the light emitting chip further comprises:
a first electrode electrically connected to the first doped semiconductor layer;
a second electrode electrically connected to the second doped semiconductor layer, wherein the first electrode and the second electrode are disposed on a same side of the light emitting chip; and
a transparent conductive layer disposed between the first electrode and the first doped semiconductor layer.

12. A light emitting device, comprising:
a light emitting chip, comprising:
a semiconductor stack structure, comprising:
a first doped semiconductor layer;
a second doped semiconductor layer; and
a light emitting semiconductor layer disposed between the first doped semiconductor layer and the second doped semiconductor layer;
a magnetic material disposed beside the light emitting chip, wherein the magnetic material does not directly contact the semiconductor stack structure;
an insulation layer disposed between the light emitting chip and the magnetic material, the insulation layer insulating the light emitting chip and the magnetic material; and
a circuit layer disposed on the insulation layer, wherein the insulation layer insulates the circuit layer and the magnetic material, and the circuit layer comprises:
a first circuit electrically connected to the first doped semiconductor layer; and
a second circuit electrically connected to the second doped semiconductor layer.

13. The light emitting device according to claim 12, wherein the light emitting chip further comprises an insulation substrate disposed between the magnetic material and the semiconductor stack structure.

14. The light emitting device according to claim 12, wherein the light emitting chip further comprises:
a first electrode electrically connected to the first doped semiconductor layer;
a second electrode electrically connected to the second doped semiconductor layer, wherein the first electrode and the second electrode are disposed on a same side of the semiconductor stack structure.

15. The light emitting device according to claim 14, wherein the magnetic material applies a magnetic field about perpendicular to the first doped semiconductor layer, the second doped semiconductor layer, and the light emitting semiconductor layer.

16. The light emitting device according to claim 14, wherein the light emitting chip further comprises a transparent conductive layer disposed between the first electrode and the first doped semiconductor layer.

17. A light emitting device, comprising:
a light emitting chip, comprising:
a semiconductor stack structure, comprising:
a first doped semiconductor layer;
a second doped semiconductor layer; and
a light emitting semiconductor layer disposed between the first doped semiconductor layer and the second doped semiconductor layer;
a first electrode electrically connected to the first doped semiconductor layer; and
a second electrode electrically connected to the second doped semiconductor layer, wherein the first electrode and the second electrode are located on a same side of the semiconductor stack structure;
a magnetic material disposed beside the light emitting chip, wherein the magnetic material has a size lager than a size of the first electrode and larger than a size of the second electrode;
an insulation layer disposed between the light emitting chip and the magnetic material, the insulation layer insulating the light emitting chip and the magnetic material; and
a circuit layer disposed on the insulation layer, wherein the insulation layer insulates the circuit layer and the magnetic material, and the circuit layer comprises:
a first circuit electrically connected to the first doped semiconductor layer; and a second circuit electrically connected to the second doped semiconductor layer.

18. The light emitting device according to claim 17, wherein an area of the magnetic material in a direction parallel to the light emitting semiconductor layer is larger than an area of the first electrode in the direction parallel to the light emitting semiconductor layer, and is larger than an area of the first electrode in the direction parallel to the light emitting semiconductor layer.

19. The light emitting device according to claim 18, wherein the area of the magnetic material in the direction parallel to the light emitting semiconductor layer is larger than an area of the semiconductor stack structure in the direction parallel to the light emitting semiconductor layer.

20. The light emitting device according to claim 17, wherein a thickness of the magnetic material is greater than 1 millimeter.

21. The light emitting device according to claim 17, wherein the magnetic material does not directly contact the semiconductor stack structure.

22. The light emitting device according to claim 17, wherein the light emitting chip further comprises a transparent conductive layer disposed between the first electrode and the first doped semiconductor layer.

23. A light emitting device, comprising:
at least one light emitting chip, comprising:
a light emitting stacking layer;
a first electrode, electrically coupled to the light emitting stacking layer; and
a second electrode, electrically coupled to the light emitting stacking layer, wherein the first electrode and the second electrode are disposed on a same side of the light emitting stacking layer; and
a magnetic material, coupled to the light emitting chip, having at least one concave for disposing the at least one light emitting chip, wherein the concave has a reflective surface for reflecting light emitted by the light emitting chip, a number of the at least one light emitting chip is more than one, a number of the at least one concave is more than one, the concaves are used for respectively disposing the light emitting chips, the reflective surfaces of the concaves are for respectively reflecting light emitted by the corresponding light emitting chips.

24. A light emitting device, comprising:
at least one light emitting chip, comprising:
a light emitting stacking layer;
a first electrode, electrically coupled to the light emitting stacking layer; and
a second electrode, electrically coupled to the light emitting stacking layer, wherein the first electrode and the second electrode are disposed on a same side of the light emitting stacking layer; and
a magnetic material, coupled to the light emitting chip, having at least one concave for disposing the at least one light emitting chip, wherein the concave has a reflective surface for reflecting light emitted by the light emitting chip, a number of the at least one light emitting chip is more than one, and one concave is used for disposing a plurality of light emitting chips.

* * * * *